United States Patent
Liu et al.

(10) Patent No.: US 11,876,623 B2
(45) Date of Patent: Jan. 16, 2024

(54) COMMUNICATION METHOD AND APPARATUS

(71) Applicant: HUAWEI TECHNOLOGIES CO., LTD., Guangdong (CN)

(72) Inventors: Rongkuan Liu, Shanghai (CN); Pengpeng Dong, Shanghai (CN); Yuanjie Li, Shanghai (CN); Shengyue Dou, Shanghai (CN); Huiying Zhu, Shanghai (CN); Zijie Xu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 110 days.

(21) Appl. No.: 17/531,961

(22) Filed: Nov. 22, 2021

(65) Prior Publication Data
US 2022/0085831 A1     Mar. 17, 2022

Related U.S. Application Data

(63) Continuation of application No. PCT/CN2020/088721, filed on May 6, 2020.

(30) Foreign Application Priority Data

May 23, 2019     (CN) .......................... 201910433553.9

(51) Int. Cl.
*H04L 1/00* (2006.01)
*H04W 72/20* (2023.01)
*H03M 13/29* (2006.01)

(52) U.S. Cl.
CPC .......... *H04L 1/0075* (2013.01); *H04W 72/20* (2023.01); *H03M 13/2948* (2013.01)

(58) Field of Classification Search
CPC ........................... H04L 1/0075; H04W 72/20
See application file for complete search history.

(56) References Cited

U.S. PATENT DOCUMENTS

| | | | |
|---|---|---|---|
| 7,779,326 B2 * | 8/2010 | Stankovic | H03M 13/6312 714/752 |
| 8,271,687 B2 | 9/2012 | Turner et al. | |

(Continued)

FOREIGN PATENT DOCUMENTS

CN     104219032 A     12/2014

OTHER PUBLICATIONS

Ce Sun, Zesong Fei, Jiqing Ni, Wei Zhou and Dai Jia; A Novel Design of Downlink Control Information Encoding and Decoding Based on Polar Codes; May 2018 Wireless Communications and Mobile Computing 2018:1-7 (Year: 2018).*

(Continued)

*Primary Examiner* — Joseph D Torres
(74) *Attorney, Agent, or Firm* — Fish & Richardson P.C.

(57) ABSTRACT

The present disclosure discloses an example communication method and apparatus. One example communication method includes receiving, by a first node, decoding information and coded data from a second node, where the coded data is obtained after data of a node group in which the first node is located is encoded, the data of the node group includes data expected to be received by at least two nodes in the node group, and the at least two nodes include the first node. Data expected to be received by the first node is obtained by the first node based on the decoding information and the coded data.

6 Claims, 5 Drawing Sheets

(56) References Cited

U.S. PATENT DOCUMENTS

| | | | | |
|---|---|---|---|---|
| 9,667,276 | B1* | 5/2017 | Tunali | H03M 13/616 |
| 2006/0015791 | A1* | 1/2006 | Kikuchi | H03M 13/2936 |
| 2006/0203766 | A1* | 9/2006 | Kim | H04W 52/0219 |
| | | | | 370/328 |
| 2011/0035639 | A1* | 2/2011 | Earnshaw | H04L 1/1812 |
| | | | | 714/E11.131 |
| 2011/0064061 | A1* | 3/2011 | Takeuchi | H04L 1/1854 |
| | | | | 370/336 |
| 2016/0373136 | A1* | 12/2016 | Ismail | H03M 13/611 |

OTHER PUBLICATIONS

Ahlswede et al., "Network Information Flow," IEEE Transactions on Information Theory, vol. 46, No. 4, Jul. 2000, 13 pages.
Guo, "Research on the Packet Retransmission Mechanism Based on Network Coding Technology," Nanjing University of Posts and Telecommunications, Mar. 2015, 64 pages (with English abstract).
PCT International Search Report and Written Opinion issued in International Application No. PCT/CN2020/088721 dated Aug. 5, 2020, 19 pages (with English translation).
Wei, "Research on the Wireless Network Based on Instantly Decodable Network Coding," Nanjing University of Posts and Telecommunications, Mar. 2016, 2017, 65 pages (with English abstract).
Dai et al., "Data Dissemination With Side Information and Feedback," IEEE Transactions on Wireless Communications, vol. 13, No. 9, Jun. 2014, 13 pages.
Extended European Search Report issued in European Application No. 20809915.0 dated Apr. 26, 2022, 8 pages.
Niu et al., "On Minimizing Average Packets Decoding Delay Based on B-DLNC for Wireless Broadcasting," 17th IEEE International Conference on Communication Technology (ICCT), Oct. 2017, 6 pages.

\* cited by examiner

COMMUNICATION METHOD AND APPARATUS

CROSS-REFERENCE TO RELATED APPLICATIONS

This application is a continuation of International Application No. PCT/CN2020/088721, filed on May 6, 2020, which claims priority to Chinese Patent Application No. 201910433553.9, filed on May 23, 2019. The disclosures of the aforementioned applications are hereby incorporated by reference in their entireties.

TECHNICAL FIELD

Embodiments of this application relate to the field of communication technologies, and in particular, to a communication method and apparatus.

BACKGROUND

In a wireless network, due to a broadcast characteristic and a dynamic time-varying characteristic of a wireless medium, a receive end may receive, when listening to a channel, data expected to be received by another receive end. Therefore, data received by different receive ends is different and complementary. Based on this feature, a transmit end may use an index coding technology to ensure that the receive end receives the data expected to be received.

However, in a current data transmission method based on the index coding technology, decoding efficiency of the receive end is relatively low.

SUMMARY

Embodiments of this application provide a communication method and apparatus, to improve decoding efficiency.

According to a first aspect, an embodiment of this application provides a communication method, including: A first node receives decoding information and coded data from a second node, where the coded data is data obtained after data of a node group in which the first node is located is encoded, the data of the node group includes data expected to be received by at least two nodes in the node group, and the at least two nodes include the first node. The first node obtains, based on the decoding information and the coded data, the data expected to be received by the first node, where the decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

In this solution, a receive end (first node) receives decoding information from a transmit end (second node), and the decoding information is related to a coding matrix or a decoding matrix corresponding to coded data. Therefore, when decoding the coded data to obtain data expected to be received by the receive end, the receive end may perform fast decoding based on the decoding information instead of performing blind decoding, so that efficiency of decoding the coded data by the receive end is improved.

With reference to the first aspect, in a possible implementation of the first aspect, the part of the decoding matrix is one of the following: a first column vector corresponding to the first node in the decoding matrix, a first row vector corresponding to the first node in the decoding matrix, a sub column vector obtained after first N rows are removed from the first column vector, a sub row vector obtained after first N columns are removed from the first row vector, and a sub decoding matrix obtained after first N rows or first N columns are removed from the decoding matrix, where N is a quantity of nodes included in the node group.

In this solution, when the part of the decoding matrix is the first column vector corresponding to the receive end or the first row vector corresponding to the receive end in the decoding matrix, the receive end can obtain complete decoding information corresponding to the receive end in the decoding matrix without calculation, to implement complete non-blind decoding. Therefore, power consumption of the receive end is low, and decoding efficiency is high. When the part of the decoding matrix is the sub column vector obtained after the first N rows are removed from the first column vector or the sub row vector obtained after the first N columns are removed from the first row vector, signaling overheads are relatively small when the transmit end sends the decoding information to the receive end. When the part of the decoding matrix is the sub decoding matrix obtained after the first N rows or first N columns are removed from the decoding matrix, the transmit end may send the decoding information to the receive end in a multicast manner, thereby consuming less resources.

With reference to the first aspect, in a possible implementation of the first aspect, an element in the coding matrix or the decoding matrix is 0 or 1; an element in the coding matrix or the decoding matrix is an integer; or an element in the coding matrix or the decoding matrix is a real number.

In this solution, an element in the coding matrix or the decoding matrix may be 0 or 1, may be an integer, or may be a real number, so that a form of the coding matrix or the decoding matrix is relatively flexible.

With reference to the first aspect, in a possible implementation of the first aspect, the decoding information is carried in downlink control information (DCI) or sidelink control information (SCI).

In this solution, a downlink message that may carry the decoding information is provided.

With reference to the first aspect, in a possible implementation of the first aspect, the decoding information is one of the following: the coding matrix corresponding to the coded data, the at least one column vector in the coding matrix, the at least one row vector in the coding matrix, the decoding matrix corresponding to the coded data, and the part of the decoding matrix; and an element in the decoding information is 0 or 1. The decoding information is located in a first indicator field of the DCI or the SCI, and a relationship between a length k of the first indicator field and the quantity N of nodes included in the node group is one of the following relationships: $N \leq k/2$, $N \leq \sqrt{k/2}$, $N \leq \sqrt{k}$, and $N \leq k$.

In this solution, it can be ensured that the length of the first indicator field of the DCI or the SCI matches the quantity of nodes included in the node group in which the receive end is located, so that the transmit end can successfully send the decoding information to the receive end, so that efficiency of decoding the coded data by the receive end is improved.

According to a second aspect, an embodiment of this application provides a communication method, including: A second node generates coded data, where the coded data is data obtained after data of a node group in which a first node is located is encoded, the data of the node group includes data expected to be received by at least two nodes in the node group, and the at least two nodes include the first node. The second node sends decoding information and the coded data to the first node, where the decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

In this solution, a transmit end (second node) sends decoding information to a receive end (first node), and the decoding information is related to a coding matrix or a decoding matrix corresponding to coded data. Therefore, when decoding the coded data to obtain data expected to be received by the receive end, the receive end may perform fast decoding based on the decoding information instead of performing blind decoding, so that efficiency of decoding the coded data by the receive end is improved.

With reference to the second aspect, in a possible implementation of the second aspect, the part of the decoding matrix is one of the following: a first column vector corresponding to the first node in the decoding matrix, a first row vector corresponding to the first node in the decoding matrix, a sub column vector obtained after first N rows are removed from the first column vector, a sub row vector obtained after first N columns are removed from the first row vector, and a sub decoding matrix obtained after first N rows or first N columns are removed from the decoding matrix, where N is a quantity of nodes included in the node group.

For beneficial effects of this solution, refer to the technical effects of the corresponding solution in the first aspect. Details are not described herein again.

With reference to the second aspect, in a possible implementation of the second aspect, an element in the coding matrix or the decoding matrix is 0 or 1; an element in the coding matrix or the decoding matrix is an integer, or an element in the coding matrix or the decoding matrix is a real number.

For beneficial effects of this solution, refer to the technical effects of the corresponding solution in the first aspect. Details are not described herein again.

With reference to the second aspect, in a possible implementation of the second aspect, the decoding information is carried in downlink control information (DCI) or sidelink control information (SCI).

For beneficial effects of this solution, refer to the technical effects of the corresponding solution in the first aspect. Details are not described herein again.

With reference to the second aspect, in a possible implementation of the second aspect, the decoding information is one of the following: the coding matrix corresponding to the coded data, the at least one column vector in the coding matrix, the at least one row vector in the coding matrix, the decoding matrix corresponding to the coded data, and the part of the decoding matrix; and an element in the decoding information is 0 or 1. The decoding information is located in a first indicator field of the DCI or the SCI, and a relationship between a length k of the first indicator field and the quantity N of nodes included in the node group is one of the following relationships: $N \leq k/2$, $N \leq \sqrt{k/2}$, $N \leq \sqrt{k}$, and $N \leq k$.

For beneficial effects of this solution, refer to the technical effects of the corresponding solution in the first aspect. Details are not described herein again.

With reference to the second aspect, in a possible implementation of the second aspect, before the second node generates the coded data, the method further includes: The second node obtains a data receiving status of at least one node included in the node group in an initial data transmission process, where a data receiving status of the first node includes a receiving status of the first node for the data expected to be received by the first node and a receiving status of the first node for data expected to be received by another node included in the node group. That a second node generates coded data includes: The second node generates the coded data based on the data receiving status of the at least one node included in the node group.

Optionally, that the second node generates the coded data based on the data receiving status of the at least one node included in the node group. The second node determines a coding matrix based on the data receiving status of the at least one node included in the node group. The second node encodes the data of the node group based on the coding matrix, to obtain the coded data.

Optionally, the coding matrix includes M pieces of coding information. In this case, that the second node encodes the data of the node group based on the coding matrix, to obtain the coded data includes: For any piece of first coding information in the M pieces of coding information, the second node encodes the data of the node group based on the first coding information, to obtain first coded data corresponding to the first coding information.

This solution provides a specific implementation of generating the coded data by the transmit end. In this manner, the generated coded data can ensure that the receive end obtains the data expected to be received.

With reference to the second aspect, in a possible implementation of the second aspect, the method further includes: The second node determines the decoding matrix based on the coding matrix.

This solution provides a specific implementation of obtaining the decoding matrix by the transmit end.

According to a third aspect, an embodiment of this application provides a communication apparatus. The apparatus is configured to perform the method according to any one of the first aspect and the possible implementations of the first aspect.

According to a fourth aspect, an embodiment of this application provides a communication apparatus. The apparatus is configured to perform the method according to any one of the second aspect and the possible implementations of the second aspect.

According to a fifth aspect, an embodiment of this application provides a communication apparatus, including a processor. The processor is coupled to a memory, and the memory is configured to store a program or instructions. When the program or the instructions are executed by the processor, the apparatus is enabled to perform the method according to any one of the first aspect and the possible implementations of the first aspect.

According to a sixth aspect, an embodiment of this application provides a communication apparatus, including a processor. The processor is coupled to a memory, and the memory is configured to store a program or instructions. When the program or the instructions are executed by the processor, the apparatus is enabled to perform the method according to any one of the second aspect and the possible implementations of the second aspect.

According to a seventh aspect, an embodiment of this application provides a storage medium, storing a computer program or instructions. When the computer program or the instructions are executed, a computer is enabled to perform the method according to any one of the first aspect and the possible implementations of the first aspect.

According to an eighth aspect, an embodiment of this application provides a storage medium, storing a computer program or instructions. When the computer program or the instructions are executed, a computer is enabled to perform the method according to any one of the second aspect and the possible implementations of the second aspect.

According to a ninth aspect, an embodiment of this application further provides a communication system, including: the communication apparatus according to the third aspect and the communication apparatus according to the fourth aspect.

According to a tenth aspect, an embodiment of this application further provides a communication system, including: the communication apparatus according to the fifth aspect and the communication apparatus according to the sixth aspect.

According to an eleventh aspect, an embodiment of this application provides a communication method, including: A first node receives a coding vector and coded data from a second node, where the coded data is data obtained after a plurality of pieces of sub-data included in data expected to be received by the first node are encoded. The first node obtains, based on the coding vector and the coded data, the data expected to be received by the first node. The plurality of pieces of sub-data included in the data expected to be received by the first node are in a one-to-one correspondence with a plurality of elements included in the coding vector. For any element in the coding vector, the element is a coefficient multiplied when sub-data corresponding to the element is encoded. In addition, when the element is a first value, the element indicates that the sub-data corresponding to the element is correctly received by the second node; and when the first element is a second value, the element indicates that the sub-data corresponding to the element is not correctly received by the second node, where the first value is a value other than the second value. In a manner, that a first node receives a coding vector and coded data from a second node includes: The first node receives at least two coding vectors and at least two pieces of coded data from at least two second nodes. That the first node obtains, based on the coding vector and the coded data, the data expected to be received by the first node includes: The first node obtains, based on the at least two coding vectors and the at least two pieces of coded data, the data expected to be received by the first node.

In this solution, a destination node (first node) may receive a coding vector and coded data from an intermediate node (second node), and the coding vector may represent a receiving status of the intermediate node for a plurality of pieces of sub-data included in data expected to be received by the destination node. Therefore, the destination node may determine, based on coding vectors sent by a plurality of intermediate nodes, receiving statuses of different intermediate nodes for the sub-data of the data expected to be received, and recover, based on coded data and the receiving statuses of the different intermediate nodes for the sub-data of the data expected to be received, the data expected to be received (that is, recover, by fully utilizing complementarity of data transmission on different transmission paths, the data expected to be received). That is, regardless of whether the intermediate node correctly receives the data that is expected to be received and sent by a source node, the intermediate node does not need to request the source node to resend the data expected to be received, so that data transmission efficiency is high.

With reference to the eleventh aspect, in a possible implementation of the eleventh aspect, the coding vector is a real number vector or a binary vector.

In this solution, the coding vector may be a real number vector or a binary vector, and a form of the coding vector is relatively flexible.

According to a twelfth aspect, an embodiment of this application provides a communication method, including: A second node generates coded data, where the coded data is data obtained after a plurality of pieces of sub-data included in data expected to be received by a first node is encoded. The second node sends a coding vector and the coded data to the first node. The plurality of pieces of sub-data included in the data expected to be received by the first node are in a one-to-one correspondence with a plurality of elements included in the coding vector. For any element in the coding vector, the element is a coefficient multiplied when sub-data corresponding to the element is encoded. In addition, when the element is a first value, the element indicates that the sub-data corresponding to the element is correctly received by the second node; and when the first element is a second value, the element indicates that the sub-data corresponding to the element is not correctly received by the second node, where the first value is a value other than the second value.

In this solution, an intermediate node (second node) sends a coding vector and coded data to a destination node (first node), and the coding vector may represent a receiving status of the intermediate node for a plurality of pieces of sub-data included in data expected to be received by the destination node. Therefore, the destination node may determine, based on coding vectors sent by a plurality of intermediate nodes, receiving statuses of different intermediate nodes for the sub-data of the data expected to be received, and recover, based on coded data and the receiving statuses of the different intermediate nodes for the sub-data of the data expected to be received, the data expected to be received (that is, recover, by fully utilizing complementarity of data transmission on different transmission paths, the data expected to be received). That is, regardless of whether the intermediate node correctly receives the data that is expected to be received and sent by a source node, the intermediate node does not need to request the source node to resend the data expected to be received, so that data transmission efficiency is high.

With reference to the twelfth aspect, in a possible implementation of the twelfth aspect, the coding vector is a real number vector or a binary vector.

In this solution, the coding vector is a real number vector or a binary vector, and a form of the coding vector is relatively flexible.

With reference to the twelfth aspect, in a possible implementation of the twelfth aspect, before the second node generates the coded data, the method further includes: The second node obtains a receiving status of the second node for the data expected to be received by the first node, where the receiving status includes a receiving status of the second node for the plurality of pieces of sub-data of the data expected to be received by the first node. That a second node generates coded data includes: The second node determines the coding vector based on the receiving status; and the second node generates the coded data based on the coding vector and the data that is expected to be received by the first node and is received by the second node.

In this solution, the intermediate node generates the coding vector and the coded data based on the receiving status for the sub-data of the data expected to be received by the destination node, and sends the coding vector and the coded data to the destination node. Therefore, the destination node may determine, based on coding vectors sent by a plurality of intermediate nodes, receiving statuses of different intermediate nodes for the sub-data of the data expected to be received, and recover the data expected to be received based on coded data and the receiving statuses of the different intermediate nodes for the sub-data of the data expected to be received (that is, recover the data expected to be received by fully utilizing complementarity of data transmission on different transmission paths). That is, regardless of whether the intermediate node correctly receives the data that is expected to be received and sent by a source node, the intermediate node does not need to request the source node to resend the data expected to be received, so that data transmission efficiency is high.

According to a thirteenth aspect, an embodiment of this application provides a communication apparatus. The apparatus is configured to perform the method according to any one of the eleventh aspect and the possible implementations of the eleventh aspect.

According to a fourteenth aspect, an embodiment of this application provides a communication apparatus. The apparatus is configured to perform the method according to any one of the twelfth aspect and the possible implementations of the twelfth aspect.

According to a fifteenth aspect, an embodiment of this application provides a communication apparatus, including a processor. The processor is coupled to a memory, and the memory is configured to store a program or instructions. When the program or the instructions are executed by the processor, the apparatus is enabled to perform the method according to any one of the eleventh aspect and the possible implementations of the eleventh aspect.

According to a sixteenth aspect, an embodiment of this application provides a communication apparatus, including a processor. The processor is coupled to a memory, and the memory is configured to store a program or instructions. When the program or the instructions are executed by the processor, the apparatus is enabled to perform the method according to any one of the twelfth aspect and the possible implementations of the twelfth aspect.

According to a seventeenth aspect, an embodiment of this application provides a storage medium, storing a computer program or instructions. When the computer program or the instructions are executed, a computer is enabled to perform the method according to any one of the eleventh aspect and the possible implementations of the eleventh aspect.

According to an eighteenth aspect, an embodiment of this application provides a storage medium, storing a computer program or instructions. When the computer program or the instructions are executed, a computer is enabled to perform the method according to any one of the twelfth aspect and the possible implementations of the twelfth aspect.

According to a nineteenth aspect, an embodiment of this application provides a communication system, including the communication apparatus according to the thirteenth aspect and the communication apparatus according to the fourteenth aspect.

According to a twentieth aspect, an embodiment of this application provides a communication system, including the communication apparatus according to the fifteenth aspect and the communication apparatus according to the sixteenth aspect.

In this application, the receive end (first node) receives the decoding information from the transmit end (second node), and the decoding information is related to the coding matrix or the decoding matrix corresponding to the coded data. Therefore, when decoding the coded data to obtain data expected to be received by the receive end, the receive end may perform fast decoding based on the decoding information instead of performing blind decoding, so that efficiency of decoding the coded data by the receive end is improved.

DESCRIPTION OF EMBODIMENTS

Before technical solutions of this application are described, the following elements are defined.

A vector including a column of elements in a matrix may be referred to as a column vector in the matrix. A vector including a row of elements in a matrix may be referred to as a row vector in the matrix. For example, a matrix $$\begin{bmatrix} 5 & 3 & 0 \\ 0 & 2 & 6 \end{bmatrix}$$

includes row vectors [5 3 0] and [0 2 6], and includes column vectors $$\begin{bmatrix} 5 \\ 0 \end{bmatrix}, \begin{bmatrix} 3 \\ 2 \end{bmatrix},$$

and $$\begin{bmatrix} 0 \\ 6 \end{bmatrix}.$$

In embodiments of this application, one row vector including M columns may also be referred to as a matrix, and one column vector including K rows may also be referred to as a matrix.

The following describes the technical solutions of this application with reference to the accompanying drawings.

It should be understood that the technical solutions of the embodiments of this application may be applied to a long term evolution (LTE) architecture, and may also be applied to a 5th generation (5G) communication system (for example, a new radio (NR) communication system). The technical solutions of the embodiments of this application may also be applied to another communication system, such as a public land mobile network (PLMN) system, a future communication system (for example, a communication system later than 5G). This is not limited in the embodiments of this application.

Figure 1:
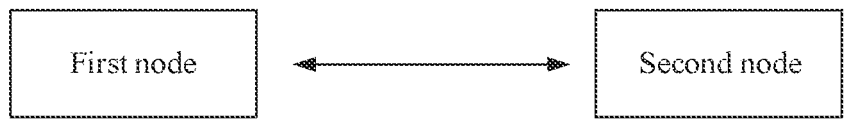
FIG. 1 shows an example of a system architecture according to an embodiment of this application.

FIG. 1 shows an example of a system architecture according to an embodiment of this application. Refer to FIG. 1. The system architecture includes a first node and a second node. In a manner, the second node may be a network device, and the first node may be a terminal. In another manner, the second node may be a terminal, and the first node is also a terminal. In another manner, the second node may be a terminal, and the first node may be a network device. In another manner, the second node may be a network device, and the first node is also a network device.

In this application, the network device may be any device having a wireless transceiver function. The network device includes but is not limited to: an evolved nodeB (eNB or eNodeB) in LTE, a gNodeB (gNB) or a transmission reception point (transmission receiving point, TRP) in new radio (NR), a subsequent evolved base station of 3rd generation partnership project (3GPP), an access node in wireless fidelity (Wi-Fi) system, a wireless relay node, a wireless backhaul node, and the like. A base station may be a macro base station, a micro base station, a picocell base station, a small cell, a relay station, a balloon station, or the like. A plurality of base stations can support networks using a same technology mentioned above, or may support networks using different technologies mentioned above. The base station may include one or more co-site or non-co-site TRPs. The network device may alternatively be a radio controller, a centralized unit ( ), and/or a distributed unit (DU) in a cloud radio access network (CRAN) scenario. The network device may alternatively be a server, a wearable device, a vehicle-mounted device, or the like. An example in which the network device is a base station is used for description below. A plurality of network devices may be base stations of a same type or base stations of different types. The base station may communicate with the terminal, or may communicate with the terminal by using a relay station. The terminal may communicate with a plurality of base stations using different technologies. For example, the terminal may communicate with a base station supporting an LTE network, or communicate with a base station supporting a 5G network, or may support a dual connection to a base station in an LTE network and a base station in a 5G network.

The terminal is a device having a wireless transceiver function. The terminal may be deployed on land, indoor or outdoor, or may be hand-held, wearable, or vehicle-mounted; may be deployed on a water surface (for example, on a ship); or may be deployed in the air (for example, on an airplane, a balloon, or a satellite). The terminal may be a mobile phone, a tablet computer (Pad), a computer having a wireless transceiver function, a virtual reality (VR) terminal device, an augmented reality (AR) terminal device, a wireless terminal in industrial control, a vehicle-mounted terminal device, a wireless terminal in self driving, a wireless terminal in telemedicine (remote medical), a wireless terminal in a smart grid, a wireless terminal in transportation safety, a wireless terminal in a smart city, a wireless terminal in a smart home, a wearable terminal device, or the like. An application scenario is not limited in the embodiments of this application. The terminal sometimes may also be referred to as a terminal device, user equipment (UE), an access terminal device, a vehicle-mounted terminal, an industrial control terminal, a UE unit, a UE station, a mobile station, a remote station, a remote terminal device, a mobile device, a UE terminal device, a terminal device, a wireless communication device, a UE agent, a UE apparatus, or the like. The terminal may be fixed or movable.

Figure 2A:
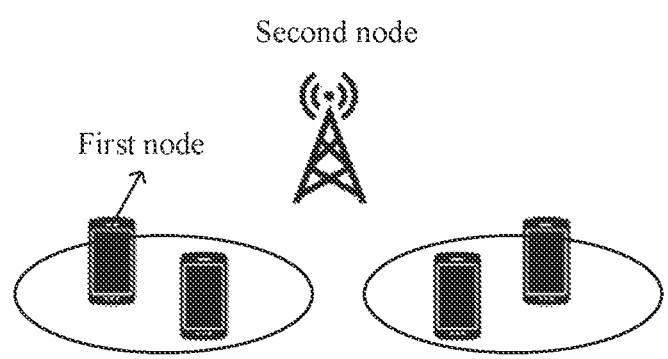
FIG. 2A is a schematic diagram of a system architecture included in the system architecture shown in FIG. 1.

When the second node is a base station and the first node is a terminal, the schematic system architecture in this embodiment may be shown in FIG. 2A. FIG. 2A is a schematic diagram of a system architecture included in the system architecture shown in FIG. 1. Refer to FIG. 2A. At least two terminals form one terminal group.

Figure 2B:
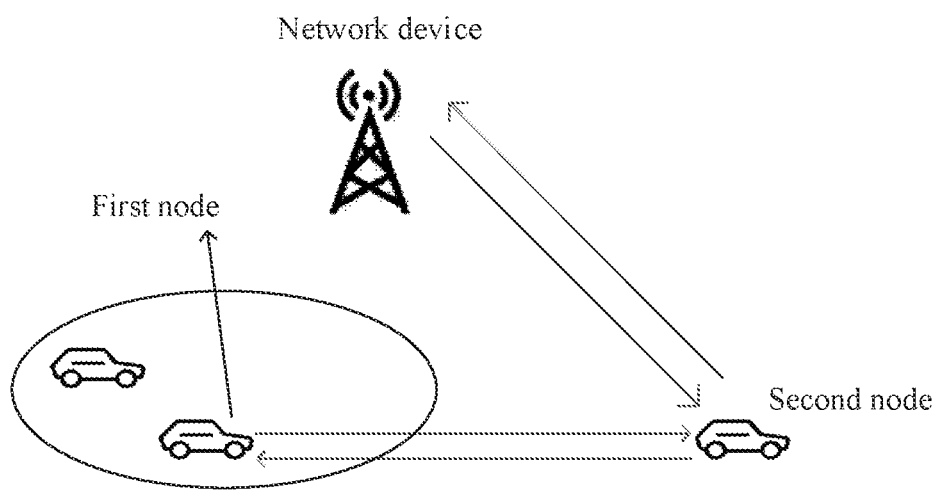
FIG. 2B is a schematic diagram of another system architecture included in the system architecture shown in FIG. 1.

When the second node and the first node are terminals, the schematic system structure in this embodiment may be shown in FIG. 2B. FIG. 2B is a schematic diagram of another system architecture included in the system architecture shown in FIG. 1. Refer to FIG. 2B. In this system architecture, at least two terminals form one terminal group. In addition, the system architecture may further include a network device.

Figure 2C:
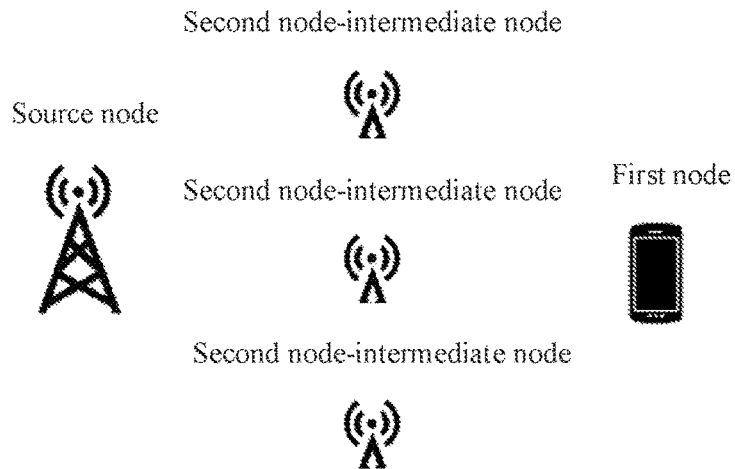
FIG. 2C is a schematic diagram of another system architecture included in the system architecture shown in FIG. 1.

When the second node is an intermediate node (also referred to as a relay node, a wireless backhaul node, or the like), and the first node is a terminal, the schematic system structure in this embodiment may be shown in FIG. 2C. FIG. 2C is a schematic diagram of another system architecture included in the system architecture shown in FIG. 1. Refer to FIG. 2C. In this system architecture, there are at least two second nodes. In addition, the system architecture further includes a source node, and the source node may be a base station.

The following describes a communication method in the embodiments of this application.

Figure 3:
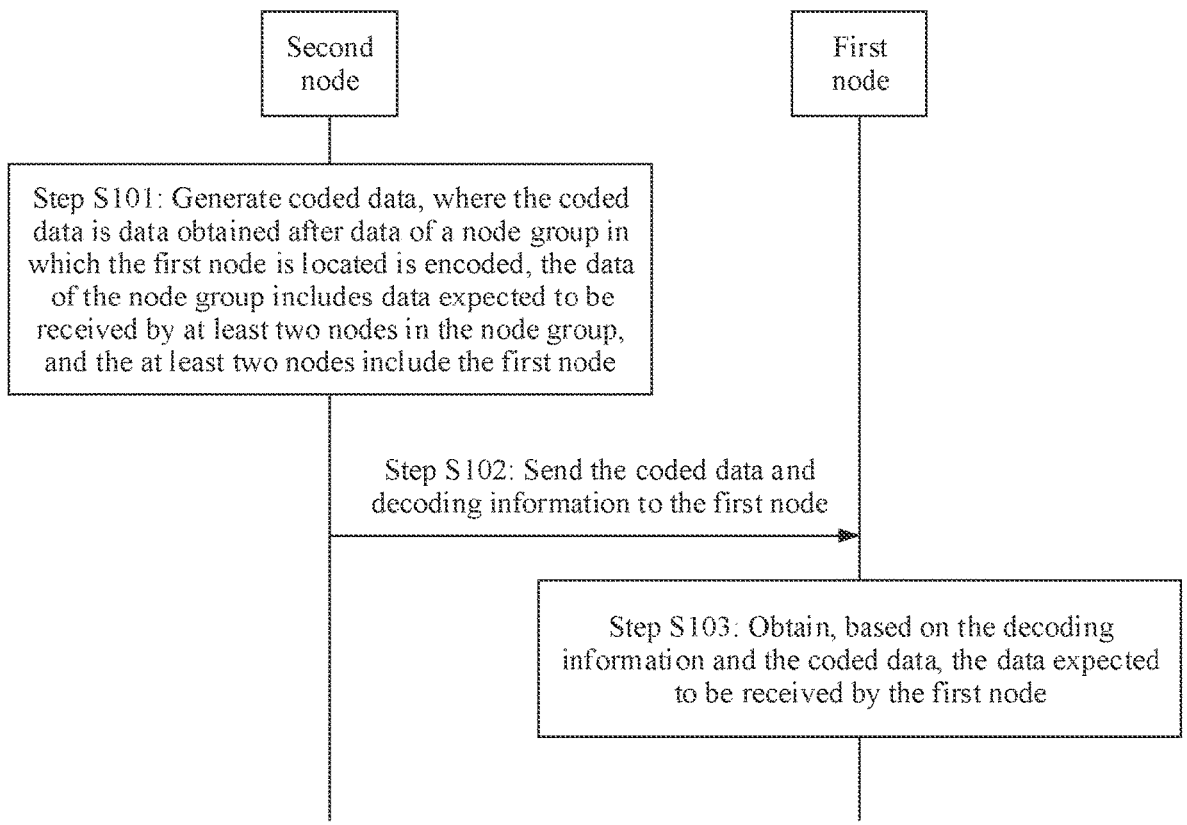
FIG. 3 is a schematic diagram of a communication method according to an embodiment of this application.

FIG. 3 is a schematic diagram of a communication method according to an embodiment of this application. Refer to FIG. 3. The method includes the following steps.

Step S101: a second node generates coded data, where the coded data is data obtained after data of a node group in which a first node is located is encoded, the data of the node group includes data expected to be received by at least two nodes in the node group, and the at least two nodes include the first node.

The second node in this embodiment may be the second node shown in FIG. 2A or FIG. 2B. The first node in this embodiment may be the first node shown in FIG. 2A or FIG. 2B.

In a manner, the second node generates coded data based on a data receiving status of at least one node included in the node group in which the first node is located. The data receiving status of the node includes a receiving status of the node for data expected to be received by the node and a receiving status of the node for data expected to be received by another node in a node group in which the node is located. The data expected to be received by the node may also be referred to as expected data of the node, data that the node needs to receive, or another possible name. This is not limited in this application.

That the second node generates coded data based on a data receiving status of at least one node included in the node group in which the first node is located includes: the second node generates a coding matrix based on the data receiving status of the at least one node included in the node group in which the first node is located. The second node encodes, by using the coding matrix, the data of the node group in which the first node is located, to obtain the coded data, where the data of the node group in which the first node is located includes the data expected to be received by the at least two nodes in the node group, and the at least two nodes include the first node. An element in the coding matrix is 0 or 1; an element in the coding matrix is an integer; or an element in the coding matrix is a real number.

Optionally, that the second node generates a coding matrix based on the data receiving status of the at least one node included in the node group in which the first node is located includes: The second node generates a feedback status matrix based on the data receiving status of the at least one node included in the node group in which the first node is located. The second node generates the coding matrix based on the feedback status matrix.

A solution to determining the data of the node group in which the first node is located is as follows: the second node may determine, based on the data receiving status of the at least one node included in the node group in which the first node is located, the data of the node group in which the first node is located.

The following describes a possible manner in which the second node obtains the data receiving status of the at least one node included in the node group in which the first node is located.

Optionally, before the second node generates the coded data based on the data receiving status of the at least one node included in the node group in which the first node is located, the second node may send, to a node in the node group in which the first node is located, data expected to be received by the node. This process may also be referred to as an initial data transmission process.

After the second node sends, to the node in the node group in which the first node is located, the data expected to be received by the node, the node may feed back, to the second node, a receiving status of each node in the node group for data expected to be received. In a manner, if the node correctly receives the data expected to be received by the node, the node may not feed back, to the second node, the receiving status of each node in the node group for the data expected to be received. The receiving status may be correct receiving or incorrect receiving.

The second node obtains, based on the receiving status that is of each node in the node group for the data expected to be received and that is fed back to the second node by the at least one node in the node group in which the first node is located, the data receiving status of the at least one node included in the node group. It may be understood that, if each node in the node group in which the first node is located feeds back, to the second node, the receiving status of each node in the node group for the data expected to be received, the second node may obtain the data receiving status of each node included in the node group.

To better understand this application, an example scenario is defined in this embodiment. Examples in the embodiments of this application are examples in the scenario. The scenario is as follows.

One node group includes a node 1, a node 2, and a node 3, and the first node is the node 1. In an initial data transmission process, the second node sends data X1 to the node 1, the second node sends data X2 to the node 2, and the second node sends data X3 to the node 3. The data X1 is data expected to be received by the node 1, the data X2 is data expected to be received by the node 2, and the data X3 is data expected to be received by the node 3.

The node 1, the node 2, and the node 3 separately feed back their respective data receiving statuses to the second node. The data receiving status of the node 1 includes receiving statuses of the node 1 for the data X1, the data X2, and the data X3. The data receiving status of the node 2 includes receiving statuses of the node 2 for the data X1, the data X2, and the data X3. The data receiving status of the node 3 includes receiving statuses of the node 3 for the data X1, the data X2, and the data X3.

The data receiving status of the node 1 is that the node 1 does not correctly receive the data X1, correctly receives the data X2, and correctly receives the data X3. The node 1 may feed back, to the second node, a receiving status vector [0 1 1] or $$\begin{bmatrix} 0 \\ 1 \\ 1 \end{bmatrix}$$

used to indicate the data receiving status of the node 1. The $1^{st}$ element 0 indicates that the node 1 does not correctly receive the data X1, the $2^{nd}$ element 1 indicates that the node 1 correctly receives the data X2, and the $3^{rd}$ element 1 indicates that the node 1 correctly receives the data X3.

The data receiving status of the node 2 is that the node 2 correctly receives the data X1, does not correctly receive the data X2, and correctly receives the data X3. The node 2 may feed back, to the second node, a receiving status vector [1 0 1] or $$\begin{bmatrix} 1 \\ 0 \\ 1 \end{bmatrix}$$

used to indicate the data receiving status of the node 2. The $1^{st}$ element 1 indicates that the node 2 correctly receives the data X1, the $2^{nd}$ element 0 indicates that the node 2 does not correctly receive the data X2, and the $3^{rd}$ element 1 indicates that the node 2 correctly receives the data X3.

The data receiving status of the node 3 is that the node 3 correctly receives the data X1, correctly receives the data X2, and does not correctly receive the data X3. The node 3 may feed back, to the second node, a receiving status vector [1 1 0] or $$\begin{bmatrix} 1 \\ 1 \\ 0 \end{bmatrix}$$

used to indicate the data receiving status of the node 3. The $1^{st}$ element 1 indicates that the node 3 correctly receives the data X1, the $2^{nd}$ element 1 indicates that the node 3 correctly receives the data X2, and the $3^{rd}$ element 0 indicates that the node 3 does not correctly receive the data X3.

It may be understood that, in the foregoing vector, 0 may alternatively be used to indicate a feedback that data is correctly received, and 1 may indicate a feedback that data is not correctly received. This is not limited in this application.

The second node determines a coding matrix based on the data receiving statuses fed back by the node 1, the node 2, and the node 3. Optionally, the second node obtains a feedback status matrix $$F = \begin{bmatrix} 0 & 1 & 1 \\ 1 & 0 & 1 \\ 1 & 1 & 0 \end{bmatrix}$$

based on the data receiving statuses fed back by the node 1, the node 2, and the node 3 (for example, obtains a feedback status matrix $$F = \begin{bmatrix} 0 & 1 & 1 \\ 1 & 0 & 1 \\ 1 & 1 & 0 \end{bmatrix}$$

based on receiving status vectors that are fed back by the node 1, the node 2, and the node 3 and that are used to represent the data receiving statuses), and obtains a coding matrix based on the feedback status matrix. When an element in the coding matrix is 0 or 1, the determined coding matrix may be $$G11 = \begin{bmatrix} 1 & 0 \\ 1 & 1 \\ 0 & 1 \end{bmatrix}$$

or $$G21 = \begin{bmatrix} 1 & 1 & 0 \\ 0 & 1 & 1 \end{bmatrix}.$$

When an element in the coding matrix is an integer, the determined coding matrix may be $$G12 = \begin{bmatrix} 5 & 0 \\ 3 & 2 \\ 0 & 6 \end{bmatrix}$$

or $$G22 = \begin{bmatrix} 5 & 3 & 0 \\ 0 & 2 & 6 \end{bmatrix}.$$

The second node determines, based on the receiving status vectors fed back by the node 1, the node 2, and the node 3, that the data of the node group in which the first node is located is: the data X1, the data X2, and the data X3.

In the following, a specific example is used to describe a process in which the second node generates the coded data.

For example, the second node encodes, by using the coding matrix, the data of the node group in which the first node is located, to obtain [X1 X2 X3]*G11=[Y1 Y2], or $$G21 * \begin{bmatrix} X1 \\ X2 \\ X3 \end{bmatrix} = \begin{bmatrix} Y1 \\ Y2 \end{bmatrix},$$

where Y1=X1+X2, Y2=X2+X3, and both Y1 and Y2 are coded data. Alternatively, the second node encodes, by using the coding matrix, the data of the node group in which the first node is located, to obtain [X1 X2 X3]*G12=[Y1 Y2], or $$G22 * \begin{bmatrix} X1 \\ X2 \\ X3 \end{bmatrix} = \begin{bmatrix} Y1 \\ Y2 \end{bmatrix},$$

where Y1=5X1+3X2, Y2=2X2+6X3, and both Y1 and Y2 are coded data.

Step S102: the second node sends the coded data and decoding information to the first node.

After generating the coded data, the second node sends the coded data to the first node. That the second node sends the coded data to the first node may also be referred to as a data retransmission process. It may be understood that a quantity of pieces of coded data may be the same as a quantity of times of data retransmission. The quantity of pieces of coded data or the quantity of times of data retransmission is greater than or equal to 1 and is less than or equal to a quantity of nodes included in the node group in which the first node is located.

For the coding matrix, a quantity of rows of the coding matrix may be the same as the quantity of pieces of coded data or the quantity of times of data retransmission, or a quantity of columns of the coding matrix may be the same as the quantity of pieces of coded data or the quantity of times of data retransmission. For example, in the example in step S101, there are two pieces of coded data: Y1 and Y2, and a data retransmission process needs to be performed twice. In this case, quantities of columns of the coding matrices G11 and G12 are both 2, which are the same as the quantity 2 of pieces of coded data or the quantity 2 of times of data retransmission. Quantities of rows of the coding matrices G21 and G22 are both 2, which are the same as the quantity 2 of pieces of coded data or the quantity 2 of times of data retransmission.

In a manner, the quantity of columns of the coding matrix may be the same as the quantity of pieces of coded data or the quantity of times of data retransmission and may be less than or equal to the quantity of nodes included in the node group in which the first node is located, and the quantity of rows of the coding matrix is the same as the quantity of nodes included in the node group in which the first node is located. In another manner, the quantity of rows of the coding matrix may be the same as the quantity of pieces of coded data or the quantity of times of data retransmission and may be less than or equal to the quantity of nodes included in the node group in which the first node is located, and the quantity of columns of the coding matrix is the same as the quantity of nodes included in the node group in which the first node is located.

In addition, to improve efficiency of a process in which the first node decodes the coded data to obtain the data expected to be received by the first node, the second node further sends decoding information to the first node. The decoding information may be carried in downlink control information (DCI), sidelink control information (SCI), a radio resource control (RRC) message, or a medium access control (MAC) control element (CE).

The decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

The coding matrix corresponding to the coded data may be the coding matrix used to generate the coded data in step S101. The decoding matrix corresponding to the coded data may be a decoding matrix obtained based on the coding matrix corresponding to the coded data, or may be referred to as a decoding matrix corresponding to the coding matrix, and the decoding matrix may be used to decode the coded data.

Step S103: the first node obtains, based on the decoding information and the coded data, the data expected to be received by the first node.

In a manner, the first node obtains, based on the decoding information, the coded data, and data obtained in an initial data transmission process, the data expected to be received by the first node.

In this embodiment, the first node receives the decoding information from the second node, and the decoding information is related to the coding matrix or the decoding matrix corresponding to the coded data. Therefore, when decoding the coded data to obtain the data expected to be received by the first node, the first node may perform fast decoding based on the decoding information instead of performing blind decoding, so that the efficiency of the process in which the first node decodes the coded data to obtain the data expected to be received by the first node is improved.

The following describes the following four cases of the decoding information shown in FIG. 3.

Case 1: the decoding information is a decoding matrix corresponding to the coded data or indication information of the decoding matrix.

In this case, the second node may send, in a multicast manner, the decoding information to a node in the node group in which the first node is located.

For an element in the decoding matrix, when an element in the coding matrix is 0 or 1, the element in the decoding matrix is 0 or 1. When an element in the coding matrix is an integer, an element in the decoding matrix is an integer or a real number. When an element in the coding matrix is a real number, an element in the decoding matrix is an integer or a real number.

In a manner, a quantity of columns of the decoding matrix is equal to the quantity of nodes included in the node group in which the first node is located, a quantity of rows of the decoding matrix may be equal to a sum of a first quantity and the quantity of nodes included in the node group in which the first node is located, and the first quantity is equal to the quantity of pieces of coded data or the quantity of times of data retransmission. In this case, a column vector included in the decoding matrix is in a one-to-one correspondence with a node included in the node group in which the first node is located. That is, one column vector in the decoding matrix is used by a node included in the node group in which the first node is located to decode the coded data, to obtain data expected to be received by the node.

It can be learned from the foregoing descriptions that the quantity of pieces of coded data or the quantity of times of data retransmission is greater than or equal to 1 and is less than or equal to the quantity of nodes included in the node group in which the first node is located. Therefore, when the quantity of columns of the decoding matrix is equal to the quantity of nodes included in the node group in which the first node is located, the quantity of rows of the decoding matrix is greater than or equal to a sum of 1 and the quantity of nodes included in the node group, and is less than or equal to twice the quantity of nodes included in the node group in which the first node is located.

In another manner, a quantity of rows of the decoding matrix is equal to the quantity of nodes included in the node group in which the first node is located, a quantity of columns of the decoding matrix may be equal to a sum of a first quantity and the quantity of nodes included in the node group in which the first node is located. In this case, a row vector included in the decoding matrix is in a one-to-one correspondence with a node included in the node group in which the first node is located. That is, one row vector in the decoding matrix is used by a node included in the node group in which the first node is located to decode the coded data, to obtain data expected to be received by the node.

Based on the foregoing same reason, when the quantity of rows of the decoding matrix is equal to the quantity of nodes included in the node group in which the first node is located, the quantity of columns of the decoding matrix is greater than or equal to a sum of 1 and the quantity of nodes included in the node group, and is less than or equal to twice the quantity of nodes included in the node group in which the first node is located.

For example, when the coding matrix is $$\begin{bmatrix} 1 & 0 \\ 1 & 1 \\ 0 & 1 \end{bmatrix},$$

the decoding matrix may be $$D = \begin{bmatrix} 0 & 1 & 0 \\ 1 & 0 & 1 \\ 0 & 0 & 0 \\ 1 & 1 & 0 \\ 0 & 0 & 1 \end{bmatrix} \text{ or } \begin{bmatrix} 0 & 1 & 0 & 1 & 0 \\ 1 & 0 & 0 & 1 & 0 \\ 0 & 1 & 0 & 0 & 1 \end{bmatrix}.$$

The $1^{st}$ column vector in D is corresponding to the node 1, and is used by the node 1 to decode the coded data to obtain the data expected to be received by the node 1. The $2^{nd}$ column vector in D is corresponding to the node 2, and is used by the node 2 to decode the coded data to obtain the data expected to be received by the node 2. The $3^{rd}$ column vector in D is corresponding to the node 3, and is used by the node 3 to decode the coded data to obtain the data expected to be received by the node 3.

The following describes a relationship between a length of a first indicator field of DCI or SCI and the quantity of nodes included in the node group in which the first node is located, when the decoding information is a decoding matrix, the decoding information is located in the first indicator field, and an element in the decoding matrix is 0 or 1.

When the decoding information is a decoding matrix, the decoding information is located in a first indicator field of DCI or SCI, and an element in the decoding matrix is 0 or 1, the decoding matrix is defined as a matrix with C rows and D columns. When the quantity of columns of the decoding matrix is equal to the quantity N of nodes included in the node group in which the first node is located, and the quantity of rows is greater than or equal to a sum of N and 1 and is less than or equal to 2N, D=N, N+1≤C≤2N, and N×(N+1)≤C×D≤2N² are satisfied. When the quantity of rows of the decoding matrix is equal to the quantity N of nodes included in the node group in which the first node is located, and the quantity of columns is greater than or equal to the sum of N and 1 and is less than or equal to 2N, C=N, N+1≤D≤2N, and N×(N+1)≤C×D≤2N² are satisfied. When the length of the first indicator field is k, the relationship between the length k of the first indicator field and the quantity N of nodes included in the node group in which the first node is located is:

$$N \le \sqrt{\frac{k}{2}}.$$

If the length of the first indicator field is fixed to k, the quantity N of nodes included in the node group in which the first node is located needs to be less than or equal to $$\sqrt{\frac{k}{2}}.$$

If the quantity of nodes included in the node group in which the first node is located is fixed to N, the length k of the first indicator field needs to be greater than or equal to $2N^2$.

When the decoding information is indication information of the decoding matrix, the indication information of the decoding matrix may be an index of the decoding matrix. When the decoding information is the indication information of the decoding matrix, signaling overheads of sending the decoding information by the second node to the first node can be reduced.

The following describes the index of the decoding matrix.

For ease of description, a data receiving status of at least one node in the node group in which the first node is located may be referred to as a data receiving status corresponding to the node group. At least one coding matrix may be obtained based on the data receiving status corresponding to the node group, that is, the data receiving status corresponding to the node group may be corresponding to the at least one coding matrix. A plurality of data receiving statuses may be corresponding to a plurality of coding matrices. The data receiving status corresponding to the node group may be represented by using a feedback status matrix. Therefore, in other words, one feedback status matrix is corresponding to at least one coding matrix. One coding matrix may be corresponding to one decoding matrix. Therefore, one feedback status matrix may be corresponding to at least one decoding matrix, or one data receiving status corresponding to the node group may be corresponding to at least one decoding matrix.

For example, a feedback status matrix $$F = \begin{bmatrix} 0 & 1 & 1 \\ 1 & 0 & 1 \\ 1 & 1 & 0 \end{bmatrix}$$

in the foregoing defined scenario is defined as $F_t$, and at least one coding matrix and at least one decoding matrix that are corresponding to $F_i$ may be shown in Table 1.

TABLE 1

| Feedback status matrix | Coding matrix | Decoding matrix |
|---|---|---|
| $F_t = \begin{bmatrix} 0 & 1 & 1 \\ 1 & 0 & 1 \\ 1 & 1 & 0 \end{bmatrix}$ | $G_{i1} = \begin{bmatrix} 1 & 0 \\ 0 & 1 \\ 0 & 1 \end{bmatrix}$ | $D_{i1} = \begin{bmatrix} 0 & 0 & 0 \\ 0 & 0 & 1 \\ 0 & 1 & 0 \\ 1 & 0 & 0 \\ 0 & 1 & 1 \end{bmatrix}$ or $\begin{bmatrix} 0 & 0 & 0 & 1 & 0 \\ 0 & 0 & 1 & 0 & 1 \\ 0 & 1 & 0 & 0 & 1 \end{bmatrix}$ |
| | $G_{i2} = \begin{bmatrix} 0 & 1 \\ 1 & 0 \\ 0 & 1 \end{bmatrix}$ | $D_{i2} = \begin{bmatrix} 0 & 0 & 1 \\ 0 & 0 & 0 \\ 1 & 0 & 0 \\ 0 & 1 & 0 \\ 1 & 0 & 1 \end{bmatrix}$ or $\begin{bmatrix} 0 & 0 & 1 & 0 & 1 \\ 0 & 0 & 0 & 1 & 0 \\ 1 & 0 & 0 & 0 & 1 \end{bmatrix}$ |
| | $G_{i3} = \begin{bmatrix} 0 & 1 \\ 0 & 1 \\ 1 & 0 \end{bmatrix}$ | $D_{i3} = \begin{bmatrix} 0 & 1 & 0 \\ 1 & 0 & 0 \\ 0 & 0 & 0 \\ 0 & 0 & 1 \\ 1 & 1 & 0 \end{bmatrix}$ or $\begin{bmatrix} 0 & 1 & 0 & 0 & 1 \\ 1 & 0 & 0 & 0 & 1 \\ 0 & 0 & 0 & 1 & 0 \end{bmatrix}$ |
| | $G_{i4} = \begin{bmatrix} 1 & 0 \\ 1 & 1 \\ 0 & 1 \end{bmatrix}$ | $D_{i4} = \begin{bmatrix} 0 & 1 & 0 \\ 1 & 0 & 1 \\ 0 & 0 & 0 \\ 1 & 1 & 0 \\ 0 & 0 & 1 \end{bmatrix}$ or $\begin{bmatrix} 0 & 1 & 0 & 1 & 0 \\ 1 & 0 & 0 & 1 & 0 \\ 0 & 1 & 0 & 0 & 1 \end{bmatrix}$ |
| | $G_{i5} = \begin{bmatrix} 1 & 1 \\ 1 & 0 \\ 0 & 1 \end{bmatrix}$ | $D_{i5} = \begin{bmatrix} 0 & 1 & 1 \\ 1 & 0 & 0 \\ 0 & 0 & 0 \\ 1 & 1 & 0 \\ 0 & 0 & 1 \end{bmatrix}$ or $\begin{bmatrix} 0 & 1 & 0 & 1 & 0 \\ 1 & 0 & 0 & 1 & 0 \\ 1 & 0 & 0 & 0 & 1 \end{bmatrix}$ |

TABLE 1-continued

| Feedback status matrix | Coding matrix | Decoding matrix |
|---|---|---|
| | $G_{i6} = \begin{bmatrix} 1 & 0 \\ 0 & 1 \\ 1 & 1 \end{bmatrix}$ | $D_{i6} = \begin{bmatrix} 0 & 0 & 1 \\ 0 & 0 & 0 \\ 1 & 1 & 0 \\ 1 & 0 & 1 \\ 0 & 1 & 0 \end{bmatrix}$ or $\begin{bmatrix} 0 & 0 & 1 & 1 & 0 \\ 0 & 0 & 1 & 0 & 1 \\ 1 & 0 & 0 & 1 & 0 \end{bmatrix}$ |
| | $G_{i7} = \begin{bmatrix} 1 \\ 1 \\ 1 \end{bmatrix}$ | $D_{i7} = \begin{bmatrix} 0 & 1 & 1 \\ 1 & 0 & 1 \\ 1 & 1 & 0 \\ 1 & 1 & 1 \end{bmatrix}$ or $\begin{bmatrix} 0 & 1 & 1 & 1 \\ 1 & 0 & 1 & 1 \\ 1 & 1 & 0 & 1 \end{bmatrix}$ |

An index may be allocated to a decoding matrix in decoding matrices corresponding to possible data receiving statuses corresponding to the node group in which the first node is located. Correspondingly, when the decoding information is indication information of the decoding matrix, the second node sends, to the first node, the index of the decoding matrix obtained based on the coding matrix of the coded data generated in step S101.

Correspondingly, when the decoding information is a decoding matrix or indication information of the decoding matrix, that the first node obtains, based on the decoding information and the coded data, the data expected to be received by the first node may be specifically: The first node obtains, based on a first row vector or first column vector corresponding to the first node in the decoding matrix, the coded data, and the data obtained in the initial data transmission process, the data expected to be received by the first node.

For example, the decoding matrix is $$D = \begin{bmatrix} 0 & 1 & 0 \\ 1 & 0 & 1 \\ 0 & 0 & 0 \\ 1 & 1 & 0 \\ 0 & 0 & 1 \end{bmatrix},$$

the node 1 performs decoding, $$[0 \quad X2 \quad X3 \quad Y1 \quad Y2] \begin{bmatrix} 0 \\ 1 \\ 0 \\ 1 \\ 0 \end{bmatrix} = X1,$$

based on the $1^{st}$ column vector in the decoding matrix, the node 2 performs decoding, $$[X1 \quad 0 \quad X3 \quad Y1 \quad Y2] \begin{bmatrix} 1 \\ 0 \\ 0 \\ 1 \\ 0 \end{bmatrix} = X2,$$

based on the $2^{nd}$ column vector in the decoding matrix, and the node 2 performs decoding, $$[X1 \quad X2 \quad 0 \quad Y1 \quad Y2] \begin{bmatrix} 0 \\ 1 \\ 0 \\ 0 \\ 1 \end{bmatrix} = X3,$$

based on the $3^{rd}$ column vector in the decoding matrix.

In this case, the first node can obtain the decoding matrix without calculation, and the first node implements non-blind decoding. Therefore, terminal power consumption is low, and decoding efficiency is high. In addition, the second node may send, in a multicast manner, the decoding information to the node in the node group in which the first node is located, thereby consuming less resources.

Case 2: the decoding information is a part of the decoding matrix or indication information of the part of the decoding matrix.

The part of the decoding matrix may be any one of a1 to a3.

a1: the part of the decoding matrix is a sub decoding matrix obtained after first N rows or first N columns are removed from the decoding matrix. N is the quantity of nodes included in the node group in which the first node is located. The decoding information may be the sub decoding matrix obtained after the first N rows or first N columns are removed from the decoding matrix, or may be indication information of the sub decoding matrix. In this case, the second node may send, in a multicast manner, the decoding information to the node included in the node group in which the first node is located.

When the quantity of columns of the decoding matrix is the same as N, the part of the decoding matrix is a sub decoding matrix obtained after the first N rows are removed from the decoding matrix. When the quantity of rows of the decoding matrix is the same as N, the part of the decoding matrix is a sub decoding matrix obtained after the first N columns are removed from the decoding matrix.

For example, when the quantity N of nodes in the node groups in which the first node is located is equal to 3, and the decoding matrix is $$\begin{bmatrix} 0 & 1 & 0 \\ 1 & 0 & 1 \\ 0 & 0 & 0 \\ 1 & 1 & 0 \\ 0 & 0 & 1 \end{bmatrix},$$

a sub decoding matrix obtained after the first N=3 rows are removed from the decoding matrix is $$\begin{bmatrix} 1 & 1 & 0 \\ 0 & 0 & 1 \end{bmatrix}.$$

When the decoding matrix is $$\begin{bmatrix} 0 & 1 & 0 & 1 & 0 \\ 1 & 0 & 0 & 1 & 0 \\ 0 & 1 & 0 & 0 & 1 \end{bmatrix},$$

a sub decoding matrix obtained after the first N=3 columns are removed from the decoding matrix is $$\begin{bmatrix} 1 & 0 \\ 1 & 0 \\ 0 & 1 \end{bmatrix}.$$

The following describes a relationship between a length of a first indicator field of DCI or SCI and the quantity of nodes included in the node group in which the first node is located, when the decoding information is a sub decoding matrix obtained after the first N rows or N columns are removed from the decoding matrix, the decoding information is located in the first indicator field, and an element in the decoding matrix is 0 or 1.

The sub decoding matrix is defined as a matrix of $C_1$ rows and $D_1$ columns. When the quantity of columns of the decoding matrix is the same as the quantity N of nodes included in the node group in which the first node is located, and the quantity of rows is greater than or equal to a sum of N and 1 and is less than or equal to 2N, $D_1=N$, $1 \le C_1 \le N$, and $N \le C_1 \times D_1 \le N^2$ are satisfied. In this case, when the length of the first indicator field is k, a relationship between k and N is $N \le \sqrt[4]{k}$. In this case, if the length of the first indicator field is fixed to k, the quantity N of nodes included in the node group in which the first node is located needs to be less than or equal to $\sqrt[4]{k}$. If the quantity of nodes included in the node group in which the first node is located is fixed to N, the length k of the first indicator field needs to be greater than or equal to $N^2$.

When the decoding information is indication information of the sub decoding matrix obtained after the first N rows or first N columns are removed from the decoding matrix, the indication information of the sub decoding matrix may be an index of the sub decoding matrix. When the decoding information is the indication information of the sub decoding matrix, signaling overheads of sending the decoding information by the second node to the first node can be reduced.

As described above, one data receiving status corresponding to the node group in which the first node is located is corresponding to one feedback status matrix, one feedback status matrix is corresponding to at least one coding matrix, and one coding matrix is corresponding to one decoding matrix. One decoding matrix is corresponding to one sub decoding matrix. Therefore, one feedback status matrix or one data receiving status corresponding to the node group is corresponding to at least one sub decoding matrix.

For example, a feedback status matrix $$F = \begin{bmatrix} 0 & 1 & 1 \\ 1 & 0 & 1 \\ 1 & 1 & 0 \end{bmatrix}$$

in the foregoing defined scenario is defined as $F_i$, and at least one coding matrix and at least one decoding matrix that are corresponding to $F_i$ may be shown in Table 2.

TABLE 2

| Feedback status matrix | Decoding matrix | | Sub decoding matrix |
|---|---|---|---|
| $F_t = \begin{bmatrix} 0 & 1 & 1 \\ 1 & 0 & 1 \\ 1 & 1 & 0 \end{bmatrix}$ | $D_{i1} = \begin{bmatrix} 0 & 0 & 0 \\ 0 & 0 & 1 \\ 0 & 1 & 0 \\ 1 & 0 & 0 \\ 0 & 1 & 1 \end{bmatrix}$ | or $\begin{bmatrix} 0 & 0 & 0 & 1 & 0 \\ 0 & 0 & 1 & 0 & 1 \\ 0 & 1 & 0 & 0 & 1 \end{bmatrix}$ | $D'_{i1} = \begin{bmatrix} 1 & 0 & 0 \\ 0 & 1 & 1 \end{bmatrix}$ or $\begin{bmatrix} 1 & 0 \\ 0 & 1 \\ 0 & 1 \end{bmatrix}$ |
| | $D_{i2} = \begin{bmatrix} 0 & 0 & 1 \\ 0 & 0 & 0 \\ 1 & 0 & 0 \\ 0 & 1 & 0 \\ 1 & 0 & 1 \end{bmatrix}$ | or $\begin{bmatrix} 0 & 0 & 1 & 0 & 1 \\ 0 & 0 & 0 & 1 & 0 \\ 1 & 0 & 0 & 0 & 1 \end{bmatrix}$ | $D'_{i2} = \begin{bmatrix} 0 & 1 & 0 \\ 1 & 0 & 1 \end{bmatrix}$ or $\begin{bmatrix} 0 & 1 \\ 1 & 0 \\ 0 & 1 \end{bmatrix}$ |
| | $D_{i3} = \begin{bmatrix} 0 & 1 & 0 \\ 1 & 0 & 0 \\ 0 & 0 & 0 \\ 0 & 0 & 1 \\ 1 & 1 & 0 \end{bmatrix}$ | or $\begin{bmatrix} 0 & 1 & 0 & 0 & 1 \\ 1 & 0 & 0 & 0 & 1 \\ 0 & 0 & 0 & 1 & 0 \end{bmatrix}$ | $D'_{i3} = \begin{bmatrix} 0 & 0 & 1 \\ 1 & 1 & 0 \end{bmatrix}$ or $\begin{bmatrix} 0 & 1 \\ 0 & 1 \\ 1 & 0 \end{bmatrix}$ |
| | $D_{i4} = \begin{bmatrix} 0 & 1 & 0 \\ 1 & 0 & 1 \\ 0 & 0 & 0 \\ 1 & 1 & 0 \\ 0 & 0 & 1 \end{bmatrix}$ | or $\begin{bmatrix} 0 & 1 & 0 & 1 & 0 \\ 1 & 0 & 0 & 1 & 0 \\ 0 & 1 & 0 & 0 & 1 \end{bmatrix}$ | $D'_{i4} = \begin{bmatrix} 1 & 1 & 0 \\ 0 & 0 & 1 \end{bmatrix}$ or $\begin{bmatrix} 1 & 0 \\ 1 & 0 \\ 0 & 1 \end{bmatrix}$ |

TABLE 2-continued

| Feedback status matrix | Decoding matrix | Sub decoding matrix |
|---|---|---|
| | $D_{i5} = \begin{bmatrix} 0 & 1 & 1 \\ 1 & 0 & 0 \\ 0 & 0 & 0 \\ 1 & 1 & 0 \\ 0 & 0 & 1 \end{bmatrix}$ or $\begin{bmatrix} 0 & 1 & 0 & 1 & 0 \\ 1 & 0 & 0 & 1 & 0 \\ 1 & 0 & 0 & 0 & 1 \end{bmatrix}$ | $D'_{i5} = \begin{bmatrix} 1 & 1 & 0 \\ 0 & 0 & 1 \end{bmatrix}$ or $\begin{bmatrix} 1 & 0 \\ 1 & 0 \\ 0 & 1 \end{bmatrix}$ |
| | $D_{i6} = \begin{bmatrix} 0 & 0 & 1 \\ 0 & 0 & 0 \\ 1 & 1 & 0 \\ 1 & 0 & 1 \\ 0 & 1 & 0 \end{bmatrix}$ or $\begin{bmatrix} 0 & 0 & 1 & 1 & 0 \\ 0 & 0 & 1 & 0 & 1 \\ 1 & 0 & 0 & 1 & 0 \end{bmatrix}$ | $D'_{i6} = \begin{bmatrix} 1 & 0 & 1 \\ 0 & 1 & 0 \end{bmatrix}$ or $\begin{bmatrix} 1 & 0 \\ 0 & 1 \\ 1 & 0 \end{bmatrix}$ |
| | $D_{i7} = \begin{bmatrix} 0 & 1 & 1 \\ 1 & 0 & 1 \\ 1 & 1 & 0 \\ 1 & 1 & 1 \end{bmatrix}$ or $\begin{bmatrix} 0 & 1 & 1 & 1 \\ 1 & 0 & 1 & 1 \\ 1 & 1 & 0 & 1 \end{bmatrix}$ | $D'_{i7} = \begin{bmatrix} 1 & 1 & 1 \end{bmatrix}$ or $\begin{bmatrix} 1 \\ 1 \\ 1 \end{bmatrix}$ |

An index may be allocated to a sub decoding matrix corresponding to a decoding matrix corresponding to a possible data receiving status corresponding to the node group in which the first node is located. Correspondingly, when the decoding information is the indication information of the decoding matrix, the second node sends, to the first node, the index of the sub decoding matrix corresponding to the decoding matrix obtained based on the coding matrix of the coded data generated in step S101.

Correspondingly, in this case, that the first node obtains, based on the decoding information and the coded data, the data expected to be received by the first node may be specifically: The first node obtains, based on a sub row vector or sub column vector corresponding to the first node in the sub decoding matrix, the coded data, and the data obtained in the initial data transmission process, the data expected to be received by the first node.

For example, when the sub decoding matrix is $$\begin{bmatrix} 1 & 1 & 0 \\ 0 & 0 & 1 \end{bmatrix},$$

the node 1 performs decoding $$[Y1 \; Y2]\begin{bmatrix} 1 \\ 0 \end{bmatrix} = Y1,$$

based on the $1^{st}$ sub column vector corresponding to the node 1 in the sub decoding matrix, and separately attempts semi-blind decoding by using the data X2 and the data X3, where decoding, Y1+X3=X1+X2+X3, fails, and decoding, Y1+X2=X1 succeeds. The node 2 performs decoding, $$[Y1 \; Y2]\begin{bmatrix} 1 \\ 0 \end{bmatrix} = Y1,$$

based on the $2^{nd}$ sub column vector corresponding to the node 2 in the sub decoding matrix, and separately attempts semi-blind decoding by using X1 and X3, where decoding, Y1+X3=X1+X2+X3, fails, and decoding, Y1+X1=X2, succeeds. The node 3 performs decoding, $$[Y1 \; Y2]\begin{bmatrix} 0 \\ 1 \end{bmatrix} = Y2,$$

based on the $3^{rd}$ sub column vector corresponding to the node 3 in the sub decoding matrix, and separately attempts semi-blind decoding by using X1 and X2, where decoding, Y2+X1=X2+X3+X1, fails, and decoding, Y2+X2=X3, succeeds. + in the foregoing descriptions indicates an exclusive OR operation.

When the part of the decoding matrix is the sub decoding matrix obtained after the first N rows or first N columns are removed from the decoding matrix, compared with the case 1, signaling overheads of sending the decoding information by the second node can be reduced to the first node. In addition, the second node may send, in a multicast manner, the decoding information to the node in the node group in which the first node is located, thereby consuming less resources.

a2: The part of the decoding matrix is a first column vector corresponding to the first node in the decoding matrix or a first row vector corresponding to the first node in the decoding matrix. The decoding information may be a first column vector corresponding to the first node in the decoding matrix or a first row vector corresponding to the first node in the decoding matrix, or may be indication information of the first row vector or indication information of the first column vector. In this case, the second node may send the decoding information to the first node in a unicast manner.

When a quantity of columns of the decoding matrix is the same as N, the part of the decoding matrix is a first column vector corresponding to the first node in the decoding matrix. When a quantity of rows of the decoding matrix is the same as N, the part of the decoding matrix is a first row vector corresponding to the first node in the decoding matrix.

For example, the decoding matrix is $$\begin{bmatrix} 0 & 1 & 0 \\ 1 & 0 & 1 \\ 0 & 0 & 0 \\ 1 & 1 & 0 \\ 0 & 0 & 1 \end{bmatrix},$$

the $1^{st}$ column vector is corresponding to the node 1, the $2^{nd}$ column vector is corresponding to the node 2, the $3^{rd}$ column vector is corresponding to the node 3, and the first node is the node 1. In this case, the first column vector is $$\begin{bmatrix} 0 \\ 1 \\ 0 \\ 1 \\ 0 \end{bmatrix}.$$

When the decoding matrix is $$\begin{bmatrix} 0 & 1 & 0 & 1 & 0 \\ 1 & 0 & 0 & 1 & 0 \\ 0 & 1 & 0 & 0 & 1 \end{bmatrix},$$

the $1^{st}$ row vector is corresponding to the node 1, the $2^{nd}$ row vector is corresponding to the node 2, the $3^{rd}$ row vector is corresponding to the node 3, and the first node is the node 1. In this case, the first row vector is [0 1 0 1 0].

The following describes a relationship between a length of a first indicator field of DCI or SCI and the quantity of nodes included in the node group in which the first node is located, when the decoding information is the first column vector corresponding to the first node in the decoding matrix or the first row vector corresponding to the first node in the decoding matrix, the decoding information is located in the first indicator field, and an element in the decoding matrix is 0 or 1.

The first column vector is defined as a matrix with $C_2$ rows and one column. When the quantity of rows of the decoding matrix is greater than or equal to a sum of N and 1 and is less than or equal to 2N, $N+1 \leq C_2 \leq 2N$ is satisfied. Alternatively, the first row vector is defined as a matrix with one row and $D_2$ columns. When the quantity of columns of the decoding matrix is greater than or equal to a sum of N and 1 and is less than or equal to 2N, $N+1 \leq D_2 \leq 2N$ is satisfied. In this case, when the length of the first indicator field is k, a relationship between k and N is $N \leq k/2$. In this case, if the length of the first indicator field is fixed to k, the quantity N of nodes included in the node group in which the first node is located needs to be less than or equal to k/2. If the quantity of nodes included in the node group in which the first node is located is fixed to N, the length k of the first indicator field needs to be greater than or equal to 2N.

When the decoding information is the indication information of the first row vector or the indication information of the first column vector, the decoding information may be an index of the first row vector or an index of the first column vector. When the decoding information is the indication information of the first row vector or the indication information of the first column vector, signaling overheads of sending the decoding information by the second node to the first node can be reduced. Table 3 shows some indexes of column vectors in the decoding matrix.

TABLE 3

| Index | Column vector in the decoding matrix |
|---|---|
| 1 | $\begin{bmatrix} 0 \\ 0 \\ 0 \\ 1 \\ 0 \end{bmatrix}$ |
| 2 | $\begin{bmatrix} 0 \\ 0 \\ 1 \\ 0 \\ 1 \end{bmatrix}$ |
| 3 | $\begin{bmatrix} 0 \\ 1 \\ 0 \\ 0 \\ 1 \end{bmatrix}$ |
| 4 | $\begin{bmatrix} 1 \\ 0 \\ 0 \\ 0 \\ 1 \end{bmatrix}$ |
| 5 | $\begin{bmatrix} 0 \\ 1 \\ 0 \\ 1 \\ 0 \end{bmatrix}$ |
| 6 | $\begin{bmatrix} 1 \\ 0 \\ 0 \\ 1 \\ 0 \end{bmatrix}$ |
| 7 | $\begin{bmatrix} 0 \\ 0 \\ 1 \\ 1 \\ 0 \end{bmatrix}$ |
| 8 | $\begin{bmatrix} 0 \\ 1 \\ 1 \\ 1 \end{bmatrix}$ |
| 9 | $\begin{bmatrix} 1 \\ 0 \\ 1 \\ 1 \end{bmatrix}$ |
| 10 | $\begin{bmatrix} 1 \\ 1 \\ 0 \\ 1 \end{bmatrix}$ |

Correspondingly, in this case, that the first node obtains, based on the decoding information and the coded data, the data expected to be received by the first node may be specifically: The first node obtains, based on the first row vector or first column vector corresponding to the first node in the decoding matrix, the coded data, and the data obtained in the initial data transmission process, the data expected to be received by the first node.

For example, the first column vector is $$\begin{bmatrix} 0 \\ 1 \\ 0 \\ 1 \\ 0 \end{bmatrix},$$

and the first node (node 1) performs decoding, $$[0 \ X2 \ X3 \ Y1 \ Y2] \begin{bmatrix} 0 \\ 1 \\ 0 \\ 1 \\ 0 \end{bmatrix} = X1,$$

based on the first column vector. It may be understood that the second node also sends, to the node 2, a column vector $$\begin{bmatrix} 1 \\ 0 \\ 0 \\ 1 \\ 0 \end{bmatrix}$$

or a row vector [1 0 0 1 0] corresponding to the node 2 in the decoding matrix, and the second node also sends, to the node 3, a column vector $$\begin{bmatrix} 0 \\ 1 \\ 0 \\ 0 \\ 1 \end{bmatrix}$$

or a row vector [0 1 0 0 1] corresponding to the node 3 in the decoding matrix. The node 2 performs decoding $$[X1 \ 0 \ X3 \ Y1 \ Y2] \begin{bmatrix} 1 \\ 0 \\ 0 \\ 1 \\ 0 \end{bmatrix} = X2,$$

based on $$\begin{bmatrix} 1 \\ 0 \\ 0 \\ 1 \\ 0 \end{bmatrix}.$$

The node 3 performs decoding, $$[X1 \ X2 \ 0 \ Y1 \ Y2] \begin{bmatrix} 0 \\ 1 \\ 0 \\ 0 \\ 1 \end{bmatrix} = X3,$$

based on $$\begin{bmatrix} 0 \\ 1 \\ 0 \\ 0 \\ 1 \end{bmatrix}.$$

When the part of the decoding matrix is the first column vector corresponding to the first node or the first row vector corresponding to the first node in the decoding matrix, compared with the case 1, signaling overheads of sending the decoding information by the second node to the first node can be reduced. In addition, the first node may obtain complete decoding information corresponding to the first node in the decoding matrix without calculation, to implement complete non-blind decoding. Therefore, power consumption of the first node is low, and decoding efficiency is high.

a3: when the part of the decoding matrix is a sub column vector obtained after first N rows are removed from the first column vector or a sub row vector obtained after first N columns are removed from the first row vector. The decoding information may be the sub column vector obtained after the first N rows are removed from the first column vector or the sub row vector obtained after the first N columns are removed from the first row vector, or may be indication information of the sub row vector or indication information of the sub column vector. In this case, the second node may send the decoding information to the first node in a unicast manner.

When the quantity of columns of the decoding matrix is the same as N, the part of the decoding matrix is the sub column vector obtained after the first N rows are removed from the first column vector. When the quantity of rows of the decoding matrix is the same as N, the part of the decoding matrix is the sub row vector obtained after the first N columns are removed from the first row vector.

For example, the data of the node group in which the first node is located is N=3. When the first column vector is $$\begin{bmatrix} 0 \\ 1 \\ 0 \\ 1 \\ 0 \end{bmatrix},$$

the sub column vector obtained after the first N rows are removed from the first column vector is $$\begin{bmatrix} 1 \\ 0 \end{bmatrix}.$$

When the first row vector is [1 0 1 0], the sub row vector obtained after the first N columns are removed from the first row vector is [1 0].

The following describes a relationship between a length of a first indicator field of DCI or SCI and the quantity of nodes included in the node group in which the first node is located, when the decoding information is the sub column vector obtained after the first N rows are removed from the first column vector or the sub row vector obtained after the first N columns are removed from the first row vector, the decoding information is located in the first indicator field, and an element in the decoding matrix is 0 or 1.

The sub column vector is defined as a matrix with $C_3$ rows and one column. When the quantity of rows of the decoding matrix is greater than or equal to a sum of N and 1 and is less than or equal to 2N, $1 \leq C_3 \leq N$ is satisfied. Alternatively, the sub row vector is defined as a matrix with one row and $D_3$ columns. When the quantity of columns of the decoding matrix is greater than or equal to a sum of N and 1 and is less than or equal to 2N, $1 \leq D_3 \leq N$ is satisfied. In this case, when the length of the first indicator field is k, a relationship between k and N is $N \leq k$. In this case, if the length of the first indicator field is fixed to k, the quantity N of nodes included in the node group in which the first node is located needs to be less than or equal to k. If the quantity of nodes included in the node group in which the first node is located is fixed to N, the length k of the first indicator field needs to be greater than or equal to N.

When the decoding information is the indication information of the sub row vector or the indication information of the sub column vector, the decoding information may be an index of the sub row vector or an index of the sub column vector. When the decoding information is the indication information of the sub row vector or the indication information of the sub column vector, signaling overheads of sending the decoding information by the second node to the first node can be reduced. Table 4 shows some indexes of sub column vectors in the decoding matrix.

TABLE 4

| Index | Sub column vector in the decoding matrix |
|---|---|
| 1 | $\begin{bmatrix} 0 \\ 1 \end{bmatrix}$ |
| 2 | $\begin{bmatrix} 1 \\ 0 \end{bmatrix}$ |
| 3 | [1] |

Correspondingly, in this case, that the first node obtains, based on the decoding information and the coded data, the data expected to be received by the first node may be specifically: The first node obtains, based on the sub column vector obtained after the first N rows are removed from the first column vector or the sub row vector obtained after the first N columns are removed from the first row vector, the coded data, and the data obtained in the initial data transmission process, the data expected to be received by the first node.

For example, the sub column vector obtained by the first node after the first N rows are removed from the first column vector is $$\begin{bmatrix} 1 \\ 0 \end{bmatrix}.$$

The first node (node 1) performs decoding, $$[Y1 \ Y2]\begin{bmatrix} 1 \\ 0 \end{bmatrix} = Y1,$$

based on the sub column vector $$\begin{bmatrix} 1 \\ 0 \end{bmatrix},$$

and separately attempts semi-blind decoding by using the data X2 and the data X3, where decoding, Y1+X3=X1+X2+X3, fails, and decoding, Y1+X2=X1, succeeds.

It may be understood that the second node also sends, to the node 2, a sub column vector $$\begin{bmatrix} 1 \\ 0 \end{bmatrix}$$

obtained after the first three rows are removed from a column vector $$\begin{bmatrix} 1 \\ 0 \\ 0 \\ 1 \\ 0 \end{bmatrix}$$

corresponding to the node 2 in the decoding matrix, or a sub row vector [1 0] obtained after the first three columns are removed from a row vector [1 0 0 1 0] corresponding to the node 2 in the decoding matrix. The second node also sends, to the node 3, a sub column vector $$\begin{bmatrix} 0 \\ 1 \end{bmatrix}$$

obtained after the first three rows are removed from a column vector $$\begin{bmatrix} 0 \\ 1 \\ 0 \\ 0 \\ 1 \end{bmatrix}$$

corresponding to the node 3 in the decoding matrix, or a sub row vector [0 1] obtained after the first three columns are removed from a row vector [0 1 0 0 1] corresponding to the node 3 in the decoding matrix. The node 2 performs decoding, $$[Y1 \ Y2]\begin{bmatrix} 1 \\ 0 \end{bmatrix} = Y1,$$

based on $$\begin{bmatrix} 1 \\ 0 \end{bmatrix},$$

and separately attempts semi-blind decoding by using the data X1 and the data X3, where decoding, Y1+X3=X1+X2+X3, fails, and decoding, Y1+X1=X2, succeeds. The node 2 performs decoding, $$[Y1 \ Y2]\begin{bmatrix} 0 \\ 1 \end{bmatrix} = Y2,$$

based on $$\begin{bmatrix} 0 \\ 1 \end{bmatrix},$$

and separately attempts semi-blind decoding by using the data X1 and the data X2, where decoding, Y2+X1=X2+X3+X1, fails, and decoding, Y2+X2=X3, succeeds. + in the foregoing decoding processes indicates an exclusive OR operation.

When the part of the decoding matrix is the sub column vector obtained after the first N rows are removed from the first column vector or the sub row vector obtained after the first N columns are removed from the first row vector, compared with the case 1, signaling overheads of sending the decoding information by the second node to the first node can be reduced. In addition, the first node may obtain, without calculation, information that is in the decoding matrix and that is used by the first node to perform decoding, and terminal power consumption is low.

Case 3: the decoding information is a coding matrix corresponding to the coded data or indication information of the coding matrix.

In this case, the second node may send, in a multicast manner, the decoding information to a node in the node group in which the first node is located.

The following describes a relationship between a length of a first indicator field of DCI or SCI and the quantity of nodes included in the node group in which the first node is located, when the decoding information is a coding matrix, the decoding information is located in the first indicator field, and an element in the coding matrix is 0 or 1.

The coding matrix is defined as a matrix with A rows and B columns. When the quantity of columns of the coding matrix is the same as the quantity of pieces of coded data or the quantity of times of data retransmission and is less than or equal to the quantity of nodes included in the node group in which the first node is located, and the quantity of rows of the coding matrix is the same as the quantity N of nodes included in the node group in which the first node is located, A=N, 1≤B≤N, and N≤A×B≤N² are satisfied. When the quantity of rows of the coding matrix is the same as the quantity of pieces of coded data or the quantity of times of data retransmission and is less than or equal to the quantity of nodes included in the node group in which the first node is located, and the quantity of columns of the coding matrix is the same as the quantity of nodes included in the node group in which the first node is located, B=N, 1≤A≤N, and N≤A×B≤N² are satisfied. When the length of the first indicator field is k, the relationship between the length k of the first indicator field and the quantity N of nodes included in the node group in which the first node is located is: N≤√k.

If the length of the first indicator field is fixed to k, the quantity N of nodes included in the node group in which the first node is located needs to be less than or equal to √k. If the quantity of nodes included in the node group in which the first node is located is fixed to N, the length k of the first indicator field needs to be greater than or equal to N².

When the decoding information is indication information of the coding matrix, the indication information of the coding matrix may be an index of the coding matrix. When the decoding information is the indication information of the coding matrix, signaling overheads of sending the decoding information by the second node to the first node can be reduced.

The following describes the index of the coding matrix.

As described above, one data receiving status corresponding to the node group in which the first node is located may be corresponding to at least one coding matrix, and one feedback status matrix is corresponding to at least one coding matrix. A plurality of data receiving statuses may be corresponding to a plurality of coding matrices.

For example, a feedback status matrix $$F = \begin{bmatrix} 0 & 1 & 1 \\ 1 & 0 & 1 \\ 1 & 1 & 0 \end{bmatrix}$$

in the foregoing defined scenario is defined as $F_i$, and at least one coding matrix corresponding to $F_i$ may be shown in Table 5.

TABLE 5

| Feedback status matrix | Coding matrix |
| --- | --- |
| $F_i = \begin{bmatrix} 0 & 1 & 1 \\ 1 & 0 & 1 \\ 1 & 1 & 0 \end{bmatrix}$ | $G_{i1} = \begin{bmatrix} 1 & 0 \\ 0 & 1 \\ 0 & 1 \end{bmatrix}$ or $\begin{bmatrix} 1 & 0 & 0 \\ 0 & 1 & 1 \end{bmatrix}$ |
| | $G_{i2} = \begin{bmatrix} 0 & 1 \\ 1 & 0 \\ 0 & 1 \end{bmatrix}$ or $\begin{bmatrix} 0 & 1 & 0 \\ 1 & 0 & 1 \end{bmatrix}$ |
| | $G_{i3} = \begin{bmatrix} 0 & 1 \\ 0 & 1 \\ 1 & 0 \end{bmatrix}$ or $\begin{bmatrix} 0 & 0 & 1 \\ 1 & 1 & 0 \end{bmatrix}$ |
| | $G_{i4} = \begin{bmatrix} 1 & 0 \\ 1 & 1 \\ 0 & 1 \end{bmatrix}$ or $\begin{bmatrix} 1 & 1 & 0 \\ 0 & 1 & 1 \end{bmatrix}$ |
| | $G_{i5} = \begin{bmatrix} 1 & 1 \\ 1 & 0 \\ 0 & 1 \end{bmatrix}$ or $\begin{bmatrix} 1 & 1 & 0 \\ 1 & 0 & 1 \end{bmatrix}$ |
| | $G_{i6} = \begin{bmatrix} 1 & 0 \\ 0 & 1 \\ 1 & 1 \end{bmatrix}$ or $\begin{bmatrix} 1 & 0 & 1 \\ 0 & 1 & 1 \end{bmatrix}$ |
| | $G_{i7} = \begin{bmatrix} 1 \\ 1 \\ 1 \end{bmatrix}$ or $[1 \ 1 \ 1]$ |

An index may be allocated to a coding matrix in coding matrices corresponding to possible data receiving statuses corresponding to the node group in which the first node is located. Correspondingly, when the decoding information is the indication information of the coding matrix, the second node sends, to the first node, the index of the coding matrix used to generate the coded data in step S101.

Correspondingly, in this case, that the first node obtains, based on the decoding information and the coded data, the data expected to be received by the first node may be specifically: The first node obtains a first row vector or first column vector corresponding to the first node in the decoding matrix based on the coding matrix and the data obtained in the initial data transmission process; and the first node obtains, based on the first row vector or first column vector, the coded data, and the data obtained in the initial data transmission process, the data expected to be received by the first node.

For example, the first node (node 1) obtains, based on a coding matrix $$\begin{bmatrix} 1 & 0 \\ 1 & 1 \\ 0 & 1 \end{bmatrix}$$

and the obtained data X2 and data X3, a column vector $$\begin{bmatrix} 0 \\ 1 \\ 0 \\ 1 \\ 0 \end{bmatrix}$$

used by the node 1 for decoding (namely, the column vector corresponding to the node 1 in the decoding matrix in Example 2), and use the column vector to perform decoding, $$[0 \ X2 \ X3 \ Y1 \ Y2] \begin{bmatrix} 0 \\ 1 \\ 0 \\ 1 \\ 0 \end{bmatrix} = X1.$$

Similarly, the node 2 obtains, based on a coding matrix $$\begin{bmatrix} 1 & 0 \\ 1 & 1 \\ 0 & 1 \end{bmatrix}$$

and the obtained data X1 and data X3, a column vector $$\begin{bmatrix} 1 \\ 0 \\ 0 \\ 1 \\ 0 \end{bmatrix}$$

used by the node 2 for decoding (namely, the column vector corresponding to the node 2 in the decoding matrix in Example 2), and use the column vector to perform decoding, $$[X1 \ 0 \ X3 \ Y1 \ Y2] \begin{bmatrix} 1 \\ 0 \\ 0 \\ 1 \\ 0 \end{bmatrix} = X2.$$

The node 3 obtains, based on a coding matrix $$\begin{bmatrix} 1 & 0 \\ 1 & 1 \\ 0 & 1 \end{bmatrix}$$

and the obtained data X1 and data X2, a column vector $$\begin{bmatrix} 0 \\ 1 \\ 0 \\ 0 \\ 1 \end{bmatrix}$$

used by the node 3 for decoding (namely, the column vector corresponding to the node 3 in the decoding matrix in Example 2), and use the column vector to perform decoding, $$[X1 \ X2 \ 0 \ Y1 \ Y2] \begin{bmatrix} 0 \\ 1 \\ 0 \\ 0 \\ 1 \end{bmatrix} = X3.$$

In this case, the second node does not need to obtain a decoding matrix corresponding to the coded data. In comparison with the case 1 and the case 2, data transmission efficiency is high. In addition, the second node may send, in a multicast manner, the decoding information to the node in the node group in which the first node is located, thereby consuming less resources.

Case 4: the decoding information is at least one column vector in the coding matrix, at least one row vector in the coding matrix, indication information of the at least one column vector, or indication information of the at least one row vector.

In this case, the second node may send, in a multicast manner, the decoding information to a node in the node group in which the first node is located.

b1: when the quantity of columns of the coding matrix is the same as the quantity of pieces of coded data or the quantity of times of data retransmission, the decoding information may be at least one column vector in the coding matrix or indication information of the at least one column vector. The at least one column vector in the coding matrix may include at least one column vector in the coding matrix. A quantity of the at least one column vector in the coding matrix may be at least 1.

For example, the coding matrix is $$\begin{bmatrix} 1 & 0 \\ 1 & 1 \\ 0 & 1 \end{bmatrix}.$$

In this case, the coding matrix may include two column vectors, which are respectively $$\begin{bmatrix} 1 \\ 1 \\ 0 \end{bmatrix} \text{ and } \begin{bmatrix} 0 \\ 1 \\ 1 \end{bmatrix}.$$

The second node sends the column vector $$\begin{bmatrix} 1 \\ 1 \\ 0 \end{bmatrix}$$

of the coding matrix to the node 1, the node 2, and the node 3 in the multicast manner, and sends the column vector $$\begin{bmatrix} 0 \\ 1 \\ 1 \end{bmatrix}$$

of the coding matrix to the node 1, the node 2, and the node 3 in the multicast manner. Correspondingly, different from the example in step S101, when the second node generates the coded data, the second node may encode, by using $$\begin{bmatrix} 1 \\ 1 \\ 0 \end{bmatrix},$$

the data of the node group in which the first node is located, to obtain coded data $$Y1: \quad [X1 \ X2 \ X3] \begin{bmatrix} 1 \\ 1 \\ 0 \end{bmatrix} = Y1, \text{ and } Y1 = X1 + X2.$$

The second node encodes, by using $$\begin{bmatrix} 0 \\ 1 \\ 1 \end{bmatrix},$$

the data of the node group in which the first node is located, to obtain coded data $$Y2: \quad [X1 \ X2 \ X3] \begin{bmatrix} 0 \\ 1 \\ 1 \end{bmatrix} = Y2, \text{ and } Y2 = X2 + X3.$$

The following describes a relationship between a length of a first indicator field of DCI or SCI and the quantity of nodes included in the node group in which the first node is located, when the decoding information is at least one column vector in the coding matrix, the decoding information is located in the first indicator field, and an element in the coding matrix is 0 or 1.

The at least one column vector in the coding matrix is defined as a matrix with $A_1$ rows and $B_1$ columns. When the quantity of columns of the coding matrix is the same as the quantity of pieces of coded data or the quantity of times of data retransmission and is less than or equal to the quantity of nodes included in the node group in which the first node is located, and the quantity of rows of the coding matrix is the same as the quantity N of nodes included in the node group in which the first node is located, $A_1=N$, $1 \leq B_1 \leq N$, and $N \leq A_1 \times B_1 \leq N^2$ are satisfied. When the length of the first indicator field is k, the relationship between the length k of the first indicator field and the quantity N of nodes included in the node group in which the first node is located is: $N \leq \sqrt{k}$. In this case, if the length of the first indicator field is fixed to k, the quantity N of nodes included in the node group in which the first node is located needs to be less than or equal to $\sqrt{k}$. If the quantity of nodes included in the node group in which the first node is located is fixed to N, the length k of the first indicator field needs to be greater than or equal to $N^2$.

When the at least one column vector in the coding matrix is a column vector in the coding matrix, $B_1=1$ and $A_1 \times B_1=N$ are satisfied. When the length k of the first indicator field, the relationship between the length k of the first indicator field and the quantity N of nodes included in the node group in which the first node is located is: $N \leq k$. In this case, if the length of the first indicator field is fixed to k, the quantity N of nodes included in the node group in which the first node is located needs to be less than or equal to k. If the quantity of nodes included in the node group in which the first node is located is fixed to N, the length k of the first indicator field needs to be greater than or equal to N.

When the decoding information is indication information of the at least one column vector in the coding matrix, the indication information of the at least one column vector in the coding matrix may be an index of the at least one column vector in the coding matrix. When the decoding information is the indication information of the at least one row vector in the coding matrix, signaling overheads of sending the decoding information by the second node to the first node can be reduced. Table 6 shows some indexes of the at least one column vector in the coding matrix.

TABLE 6

| Index | At least one column vector in the decoding matrix |
|---|---|
| 1 | $\begin{bmatrix} 0 \\ 1 \\ 1 \end{bmatrix}$ |
| 2 | $\begin{bmatrix} 1 \\ 0 \\ 1 \end{bmatrix}$ |

TABLE 6-continued

| Index | At least one column vector in the decoding matrix |
|---|---|
| 3 | $\begin{bmatrix} 1 \\ 1 \\ 0 \end{bmatrix}$ |
| 4 | $\begin{bmatrix} 1 \\ 1 \\ 1 \end{bmatrix}$ | b2: when the quantity of rows of the coding matrix is the same as the quantity of pieces of coded data or the quantity of times of data retransmission, the decoding information is at least one row vector in the coding matrix or indication information of the at least one row vector. The at least one row vector in the coding matrix may include at least one row vector in the coding matrix. A quantity of the at least one row vector in the coding matrix may be at least 1.

For example, the coding matrix is $$\begin{bmatrix} 1 & 1 & 0 \\ 0 & 1 & 1 \end{bmatrix}.$$

In this case, the coding matrix may include two row vectors, which are respectively [1 1 0] and [0 1 1].

The following describes a relationship between a length of a first indicator field of DCI or SCI and the quantity N of nodes included in the node group in which the first node is located, when the decoding information is at least one row vector in the coding matrix, the decoding information is located in the first indicator field, and an element in the coding matrix is 0 or 1.

The at least one row vector in the coding matrix is defined as a matrix with $A_1$ rows and $B_1$ columns. When the quantity of rows of the coding matrix is the same as the quantity of pieces of coded data or the quantity of times of data retransmission and is less than or equal to the quantity of nodes included in the node group in which the first node is located, and the quantity of columns of the coding matrix is the same as the quantity N of nodes included in the node group in which the first node is located, $B_1=N$, $1 \leq A_1 \leq N$, and $N \leq A_1 \times B_1 \leq N^2$ are satisfied. When the length of the first indicator field is k, the relationship between the length k of the first indicator field and the quantity N of nodes included in the node group in which the first node is located is: $N \leq \sqrt{k}$. In this case, if the length of the first indicator field is fixed to k, the quantity N of nodes included in the node group in which the first node is located needs to be less than or equal to $\sqrt{k}$. If the quantity of nodes included in the node group in which the first node is located is fixed to N, the length k of the first indicator field needs to be greater than or equal to $N^2$.

When the at least one row vector in the coding matrix is a row vector in the coding matrix, $A_1=1$ and $A_1 \times B_1=N$ are satisfied. When the length k of the first indicator field, the relationship between the length k of the first indicator field and the quantity N of nodes included in the node group in which the first node is located is: $N \leq k$. In this case, if the length of the first indicator field is fixed to k, the quantity N of nodes included in the node group in which the first node is located needs to be less than or equal to k. If the quantity of nodes included in the node group in which the first node is located is fixed to N, the length k of the first indicator field needs to be greater than or equal to N.

When the decoding information is indication information of the at least one row vector in the coding matrix, the indication information of the at least one row vector in the coding matrix may be an index of the at least one row vector in the coding matrix. When the decoding information is the indication information of the at least one row vector in the coding matrix, signaling overheads of sending the decoding information by the second node to the first node can be reduced.

Correspondingly, in this case, that the first node obtains, based on the decoding information and the coded data, the data expected to be received by the first node may be specifically: The first node obtains a first row vector or first column vector corresponding to the first node in the decoding matrix based on the at least one column vector or row vector in the coding matrix and the data obtained in the initial data transmission process; and the first node obtains, based on the first row vector or first column vector, the coded data, and the data obtained in the initial data transmission process, the data expected to be received by the first node.

For example, the first node (node 1), the node 2, and the node 3 obtain a coding matrix $$\begin{bmatrix} 1 & 0 \\ 1 & 1 \\ 0 & 1 \end{bmatrix}$$

based on column vectors $$\begin{bmatrix} 1 \\ 1 \\ 0 \end{bmatrix} \text{ and } \begin{bmatrix} 0 \\ 1 \\ 1 \end{bmatrix}$$

in the coding matrix.

The node 1 obtains, based on the coding matrix $$\begin{bmatrix} 1 & 0 \\ 1 & 1 \\ 0 & 1 \end{bmatrix}$$

and the obtained data X2 and data X3, a column vector $$\begin{bmatrix} 0 \\ 1 \\ 0 \\ 1 \\ 0 \end{bmatrix}$$

used by the node 1 for decoding (namely, the column vector corresponding to the node 1 in the decoding matrix in Example 2), and use the column vector to perform decoding, $$[0 \; X2 \; X3 \; Y1 \; Y2] \begin{bmatrix} 0 \\ 1 \\ 0 \\ 0 \\ 1 \\ 0 \end{bmatrix} = X1.$$

Similarly, the node 2 obtains, based on the coding matrix $$\begin{bmatrix} 1 & 0 \\ 1 & 1 \\ 0 & 1 \end{bmatrix}$$

and the obtained data X1 and data X3, a column vector $$\begin{bmatrix} 1 \\ 0 \\ 0 \\ 1 \\ 0 \end{bmatrix}$$

used by the node 2 for decoding (namely, the column vector corresponding to the node 2 in the decoding matrix in Example 2), and use the column vector to perform decoding $$[X1 \; 0 \; X3 \; Y1 \; Y2] \begin{bmatrix} 1 \\ 0 \\ 0 \\ 1 \\ 0 \end{bmatrix} = X2.$$

The node 3 obtains, based on the coding matrix $$\begin{bmatrix} 1 & 0 \\ 1 & 1 \\ 0 & 1 \end{bmatrix}$$

and the obtained data X1 and data X2, a column vector $$\begin{bmatrix} 0 \\ 1 \\ 0 \\ 0 \\ 1 \end{bmatrix}$$

used by the node 2 for decoding (namely, the column vector corresponding to the node 3 in the decoding matrix in Example 2), and use the column vector to perform decoding, $$[X1 \; X2 \; 0 \; Y1 \; Y2] \begin{bmatrix} 0 \\ 1 \\ 0 \\ 0 \\ 1 \end{bmatrix} = X3.$$

In this case, the second node does not need to obtain a decoding matrix corresponding to the coded data. In comparison with the case 1 and the case 2, data transmission efficiency is high. In addition, the second node may send, in a multicast manner, the decoding information to the node in the node group in which the first node is located, thereby consuming less resources.

The foregoing describes the communication method provided in the embodiment of this application by using the specific embodiments. The following describes another communication method provided in the embodiments of this application with reference to a specific embodiment.

Figure 4:
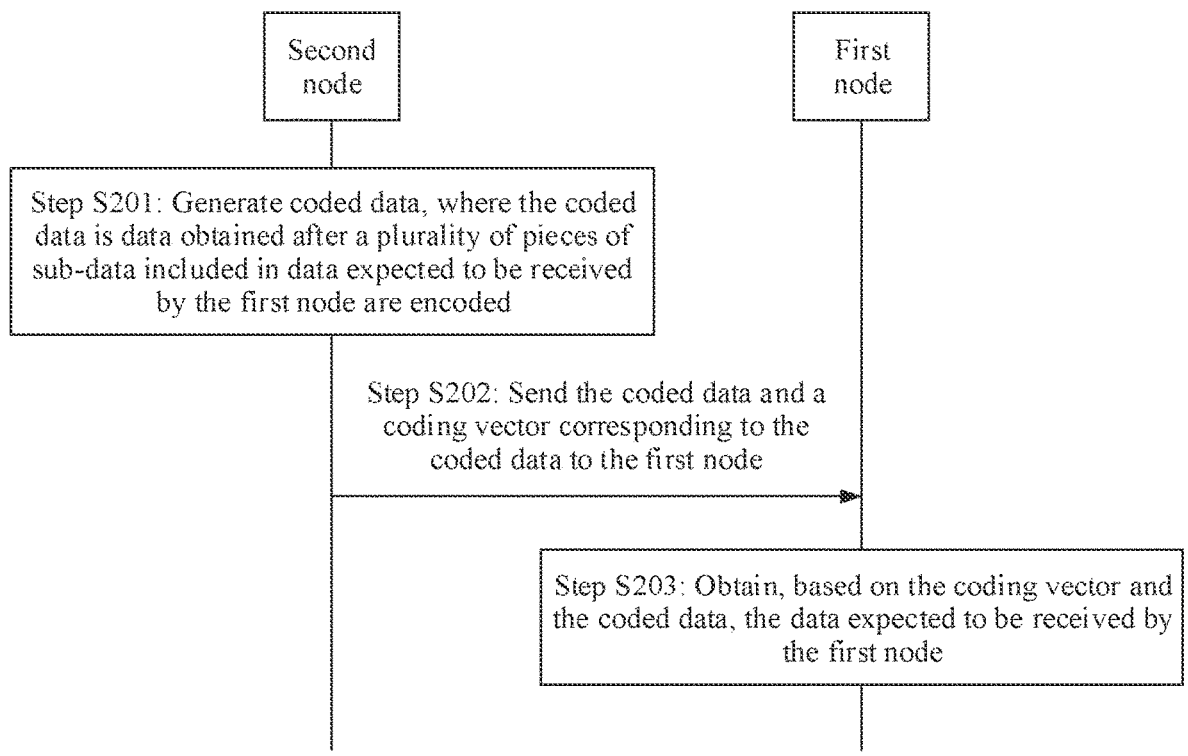
FIG. 4 is a schematic diagram of a communication method according to another embodiment of this application.

FIG. 4 is a schematic diagram of a communication method according to another embodiment of this application. Refer to FIG. 4. The method in this embodiment includes the following steps.

Step S201: a second node generates coded data, where the coded data is data obtained after a plurality of pieces of sub-data included in data expected to be received by a first node are encoded.

The second node in this embodiment may be the second node in the system architecture shown in FIG. 2C, namely, an intermediate node.

The second node receives, from a source node, the data expected to be received by the first node. The data expected to be received by the first node includes the plurality of pieces of sub-data, which are denoted as $\{Z_1, \ldots, Z_l, \ldots, Z_L\}$, where $l=1, \ldots, L$, and $Z_l$ is an $l^{th}$ piece of sub-data of the data expected to be received by the first node. The source node may be a network device such as a base station.

The second node obtains a receiving status of the second node for the data expected to be received by the first node, where the receiving status includes receiving statuses of the second node for the plurality of pieces of sub-data of the data expected to be received by the first node. A receiving status for sub-data is that the sub-data is correctly received or not correctly received.

Then, the second node generates a coding vector based on the receiving statuses, and encodes, based on the coding vector, the sub-data that is included in the data expected to be received by the first node and that is received by the second node, to obtain the coded data.

A plurality of elements included in the coding vector are in a one-to-one correspondence with the plurality of pieces of sub-data included in the data expected to be received by the first node. That is, a quantity of elements included in the coding vector is the same as a quantity of pieces of sub-data included in the data expected to be received by the first node. The coding vector may be denoted as $v=(v_1, \ldots v_l, \ldots, v_L)$, where $v_l$ is corresponding to $Z_l$. The coded data is denoted as $\{v_1 Z_1, \ldots v_l Z_l, \ldots, v_L Z_L\}$.

In a manner, the coding vector is a binary vector. If $v_l=1$, it indicates that the second node correctly receives $Z_l$. If $v_l=0$, it indicates that the second node does not correctly receive $Z_l$.

In another manner, the coding vector is a real number vector. $v_l$ indicates a coefficient of $Z_l$. Similarly, if $v_l$ is not 0, it indicates that the second node correctly receives $Z_l$. If $v_l$=0, it indicates that the second node does not correctly receive $Z_l$.

In conclusion, for any element in the coding vector, the element is a coefficient multiplied when sub-data corresponding to the element is encoded. In addition, when the element is a first value, the element indicates that the sub-data corresponding to the element is correctly received by the second node; and when the element is a second value, the element indicates that the sub-data corresponding to the element is not correctly received by the second node, where the first value is a value other than the second value. The second value may be 0.

Step S202: the second node sends the coded data and the coding vector corresponding to the coded data to the first node.

The coding vector corresponding to the coded data is the coding vector used to generate the coded data. The coding vector may be carried in DCI, SCI, an RRC message, or a MAC CE message.

Step S203. the first node obtains, based on the coding vector and the coded data, the data expected to be received by the first node.

There are at least two second nodes. In other words, the first node needs to receive at least two pieces of coded data and at least two coding vectors from the at least two second nodes. It may be understood that the first node receives one piece of coded data and one coding vector from one second node.

The first node obtains, based on the at least two pieces of coded data and the at least two coding vectors, the data expected to be received by the first node.

For example, the source node sends data X1 to intermediate nodes R1 and R2, the data X1 is the data expected to be received by the first node, and the data X1 includes four pieces of sub-data $\{Z_1, Z_2, Z_3, Z_4\}$.

When receiving the data X1, the intermediate node R1 correctly receives the sub-data $\{Z_1, Z_2, Z_4\}$, but does not receive the sub-data $\{Z_3\}$, and the intermediate node R1 generates a coding vector v=(1,1,0,1). The intermediate node R1 sends the coded vector v=(1,1,0,1) and coded data $\{1 \times Z_1, 1 \times Z_2, 0 \times Z_3, 1 \times Z_4\}$ to the first node.

When receiving the data X1, the intermediate node R2 correctly receives the sub-data $\{Z_1, Z_3, Z_4\}$, but does not receive the sub-data $\{Z_2\}$, and the intermediate node R2 generates a coding vector v=(1,0,1,1). The intermediate node R2 sends the coded vector v=(1,0,1,1) and coded data$\{1 \times Z_1, 0 \times Z_2, 1 \times Z_3, 1 \times Z_4\}$ to the first node.

The first node correctly receives the coding vector v=(1,1,0,1), the coded data $\{1 \times Z_1, 1 \times Z_2, 0 \times Z_3, 1 \times Z_4\}$, the coding vector v=(1,0,1,1), and the coded data $\{1 \times Z_1, 0 \times Z_2, 1 \times Z_3, 1 \times Z_4\}$, and may recover, by using an algorithm, the data X1 sent by the source node.

In this embodiment, a destination node (first node) may receive a coding vector and coded data from an intermediate node (second node), and the coding vector may represent a receiving status of the intermediate node for a plurality of pieces of sub-data included in data expected to be received by the destination node. Therefore, the destination node may determine, based on coding vectors sent by a plurality of intermediate nodes, receiving statuses of different intermediate nodes for the sub-data of the data expected to be received, and recover, based on coded data and the receiving statuses of the different intermediate nodes for the sub-data of the data expected to be received, the data expected to be received (that is, recover, by fully utilizing complementarity of data transmission on different transmission paths, the data expected to be received). That is, regardless of whether the intermediate node correctly receives the data that is expected to be received and sent by a source node, the intermediate node does not need to request the source node to resend the data expected to be received, so that data transmission efficiency is high.

Corresponding to the method provided in the foregoing method embodiment, an embodiment of this application further provides a corresponding apparatus. The apparatus includes a corresponding module configured to perform the foregoing embodiment. The module may be software, hardware, or a combination of software and hardware.

Figure 5:
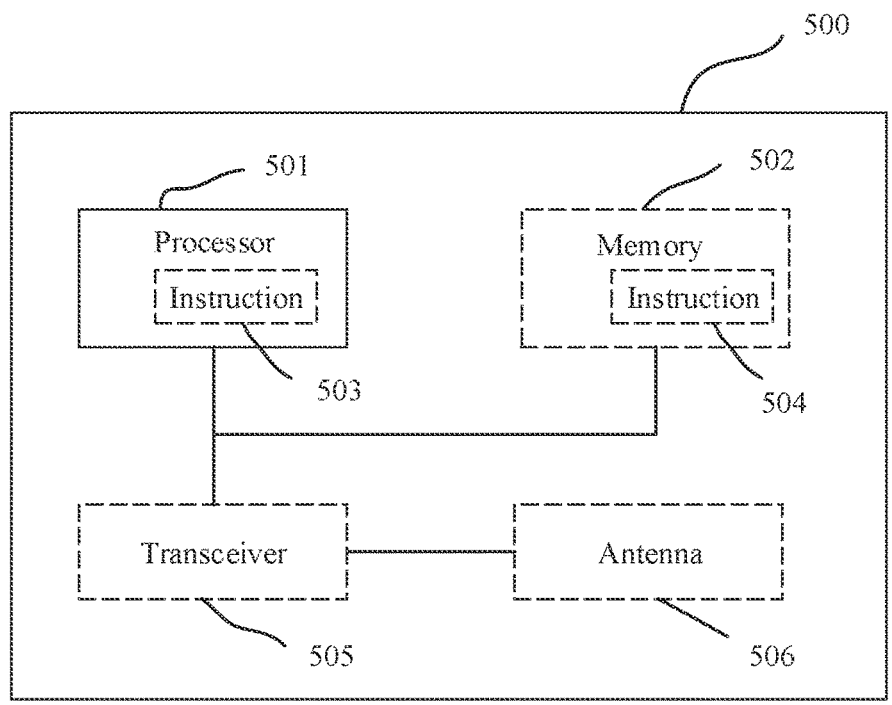
FIG. 5 is a schematic diagram of a structure of an apparatus according to an embodiment of this application.

FIG. 5 is a schematic diagram of a structure of an apparatus according to an embodiment of this application. Refer to FIG. 5. The apparatus 500 may be a network device, may be a terminal device, may be a chip, a chip system, a processor, or the like that supports the network device in implementing the foregoing method, or may be a chip, a chip system, a processor, or the like that supports implementing the foregoing method. The apparatus 500 may be configured to implement the methods that are corresponding to the first node or the second node and that are described in the foregoing method embodiments. For details, refer to the descriptions in the foregoing method embodiments.

The apparatus 500 may include one or more processors 501. The processor 501 may also be referred to as a processing unit, and may implement a specific control function. The processor 501 may be a general-purpose processor, a dedicated processor, or the like. For example, the processor may be a baseband processor or a central processing unit. The baseband processor may be configured to process a communication protocol and communication data. The central processing unit may be configured to: control a communication apparatus (for example, a base station, a baseband chip, a terminal, a terminal chip, a DU, or a CU), execute a software program, and process data of the software program.

In an optional design, the processor 501 may also store instructions and/or data 503. The instructions and/or data 503 may be run by the processor 501, to enable the apparatus 500 to perform the methods described in the foregoing method embodiments.

In another optional design, the processor 501 may include a transceiver unit 505 configured to implement receiving and sending functions. For example, the transceiver unit may be a transceiver circuit, an interface, or an interface circuit. A transceiver circuit, an interface, or an interface circuit configured to implement the receiving and sending functions may be separated, or may be integrated together. The transceiver circuit, the interface, or the interface circuit may be configured to read and write code/data; or the transceiver circuit, the interface, or the interface circuit may be configured to transmit or transfer a signal.

In still another possible design, the apparatus 500 may include a circuit. The circuit may implement the sending, receiving, or communication function in the foregoing method embodiments.

Optionally, the apparatus 500 may include one or more memories 502. The memory 502 may store instructions 504. The instructions may be run on the processor 501, to enable the apparatus 500 to perform the methods described in the foregoing method embodiments. Optionally, the memory 502 may further store data. Optionally, the processor 501 may further store instructions and/or data. The processor 501 and the memory 502 may be disposed separately, or may be integrated together. For example, correspondences described in the foregoing method embodiments may be stored in the memory, or may be stored in the processor.

Optionally, the apparatus 500 may further include a transceiver 505 and an antenna 506. The processor 501 may be referred to as a processing unit, and controls the apparatus 500. The transceiver 505 may be referred to as a transceiver unit, a transceiver machine, a transceiver circuit, a transceiver, or the like, and is configured to implement the receiving and sending functions.

In a first possible design, the apparatus 500 (for example, an integrated circuit, a wireless device, a circuit module, or a terminal device) may include the processor 501 and the transceiver 505.

The transceiver 505 is configured to receive decoding information and coded data from a second node, where the coded data is data obtained after data of a node group in which the apparatus 500 is located is encoded, the data of the node group includes data expected to be received by at least two nodes in the node group, and the at least two nodes include the apparatus 500. The processor 501 is configured to obtain, based on the decoding information and the coded data, the data expected to be received by the apparatus 500, where the decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

The second node in this embodiment may be a network device or a terminal device.

In this solution, the apparatus 500 receives the decoding information from the second node, and the decoding information is related to the coding matrix or the decoding matrix corresponding to the coded data. Therefore, when decoding the coded data to obtain the data expected to be received by the apparatus 500, the apparatus 500 may perform fast decoding based on the decoding information instead of performing blind decoding, so that the efficiency of the process in which the apparatus 500 decodes the coded data to obtain the data expected to be received by the apparatus 500 is improved.

Optionally, the part of the decoding matrix is one of the following: a first column vector corresponding to the apparatus 500 in the decoding matrix, a first row vector corresponding to the apparatus 500 in the decoding matrix, a sub column vector obtained after first N rows are removed from the first column vector, a sub row vector obtained after first N columns are removed from the first row vector, and a sub decoding matrix obtained after first N rows or first N columns are removed from the decoding matrix, where N is a quantity of nodes included in the node group.

In this solution, when the part of the decoding matrix is the first column vector corresponding to the apparatus 500 or the first row vector corresponding to the apparatus 500 in the decoding matrix, the apparatus 500 can obtain complete decoding information corresponding to the apparatus 500 in the decoding matrix without calculation, to implement complete non-blind decoding. Therefore, power consumption of the apparatus 500 is low, and decoding efficiency is high. When the part of the decoding matrix is the sub column vector obtained after the first N rows are removed from the first column vector or the sub row vector obtained after the first N columns are removed from the first row vector, signaling overheads are relatively small when the second node sends the decoding information to the apparatus 500. When the part of the decoding matrix is the sub decoding matrix obtained after the first N rows or first N columns are removed from the decoding matrix, the second node may send the decoding information to the apparatus 500 in a multicast manner, thereby consuming less resources.

Optionally, an element in the coding matrix or the decoding matrix is 0 or 1; an element in the coding matrix or the decoding matrix is an integer; or an element in the coding matrix or the decoding matrix is a real number.

In this solution, an element in the coding matrix or the decoding matrix may be 0 or 1, may be an integer, or may be a real number, so that a form of the coding matrix or the decoding matrix is relatively flexible.

Optionally, the decoding information is carried in downlink control information (DCI) or a sidelink control information (SCI).

In this solution, a downlink message that may carry the decoding information is provided.

Optionally, the decoding information is one of the following: the coding matrix corresponding to the coded data, the at least one column vector in the coding matrix, the at least one row vector in the coding matrix, the decoding matrix corresponding to the coded data, and the part of the decoding matrix; and an element in the decoding information is 0 or 1. The decoding information is located in a first indicator field of the DCI or the SCI, and a relationship between a length k of the first indicator field and the quantity N of nodes included in the node group is one of the following relationships: $N \le k/2$, $N \le \sqrt{k/2}$, $N \le \sqrt{k}$, and $N \le k$.

In this solution, it can be ensured that the length of the first indicator field of the DCI or the SCI matches the quantity of nodes included in the node group in which the apparatus 500 is located, so that the second node can successfully send the decoding information to the apparatus 500, so that efficiency of the process in which the apparatus 500 decodes the coded data to obtain the data expected to be received by the apparatus 500 is improved.

In a second possible design, the apparatus 500 (for example, an integrated circuit, a wireless device, a circuit module, or a terminal device) may include the processor 501 and the transceiver 505.

The processor 501 is configured to generate coded data, where the coded data is data obtained after data of a node group in which a first node is located is encoded, the data of the node group includes data expected to be received by at least two nodes in the node group, and the at least two nodes include the first node. The transceiver 505 is configured to send decoding information and the coded data to the first node, where the decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

The first node in this embodiment may be a terminal device.

In this solution, the apparatus 500 sends the decoding information to the first node, and the decoding information is related to the coding matrix or the decoding matrix corresponding to the coded data. Therefore, when decoding the coded data to obtain the data expected to be received by the first node, the first node may perform fast decoding based on the decoding information instead of performing blind decoding, so that efficiency of decoding the coded data by the first node is improved.

Optionally, the part of the decoding matrix is one of the following: a first column vector corresponding to the first node in the decoding matrix, a first row vector corresponding to the first node in the decoding matrix, a sub column vector obtained after first N rows are removed from the first column vector, a sub row vector obtained after first N columns are removed from the first row vector, and a sub decoding matrix obtained after first N rows or first N columns are removed from the decoding matrix, where N is a quantity of nodes included in the node group.

In this solution, when the part of the decoding matrix is the first column vector corresponding to the first node or the first row vector corresponding to the first node in the decoding matrix, the first node can obtain complete decoding information corresponding to the first node in the decoding matrix without calculation, to implement complete non-blind decoding. Therefore, power consumption of the first node is low, and decoding efficiency is high. When the part of the decoding matrix is the sub column vector obtained after the first N rows are removed from the first column vector or the sub row vector obtained after the first N columns are removed from the first row vector, signaling overheads are relatively small when the apparatus 500 sends the decoding information to the apparatus. When the part of the decoding matrix is the sub decoding matrix obtained after the first N rows or first N columns are removed from the decoding matrix, the apparatus 500 may send the decoding information to the apparatus in a multicast manner, thereby consuming less resources.

Optionally, an element in the coding matrix or the decoding matrix is 0 or 1; an element in the coding matrix or the decoding matrix is an integer; or an element in the coding matrix or the decoding matrix is a real number.

In this solution, an element in the coding matrix or the decoding matrix may be 0 or 1, may be an integer, or may be a real number, so that a form of the coding matrix or the decoding matrix is relatively flexible.

Optionally, the decoding information is carried in downlink control information (DCI) or a sidelink control information (SCI).

In this solution, a downlink message that may carry the decoding information is provided.

Optionally, the decoding information is one of the following: the coding matrix corresponding to the coded data, the at least one column vector in the coding matrix, the at least one row vector in the coding matrix, the decoding matrix corresponding to the coded data, and the part of the decoding matrix; and an element in the decoding information is 0 or 1. The decoding information is located in a first indicator field of the DCI or the SCI, and a relationship between a length k of the first indicator field and the quantity N of nodes included in the node group is one of the following relationships: $N \leq k/2$, $N \leq \sqrt{k/2}$, $N \leq \sqrt{k}$, and $N \leq k$.

In this solution, it can be ensured that the length of the first indicator field of the DCI or the SCI matches the quantity of nodes included in the node group in which the first node is located, so that the apparatus 500 can successfully send the decoding information to the first node, so that efficiency of the process in which the first node decodes the coded data to obtain the data expected to be received by the first node is improved.

In a third possible design, the apparatus 500 may further implement the method corresponding to the first node or the second node in the embodiment shown in FIG. 4 in the embodiments of this application.

The processor and the transceiver described in this application may be implemented on an integrated circuit (IC), an analog IC, a radio frequency integrated circuit RFIC, a hybrid signal IC, an application-specific integrated circuit (ASIC), a printed circuit board (PCB), an electronic device, or the like. The processor and the transceiver may alternatively be manufactured by using various IC process technologies, for example, a complementary metal oxide semiconductor (CMOS), an N-channel metal oxide semiconductor (NMOS), a P-channel metal oxide semiconductor (PMOS), a bipolar junction transistor (BJT), a bipolar CMOS (BiCMOS), silicon germanium (SiGe), and gallium arsenide (GaAs).

The apparatus described in the foregoing embodiment may be a network device or a terminal device. However, a scope of the apparatus described in this application is not limited thereto, and a structure of the apparatus may not be limited by FIG. 5. The apparatus may be an independent device or may be a part of a relatively large device. For example, the apparatus may be:

(1) an independent integrated circuit IC, a chip, or a chip system or subsystem;

(2) a set including one or more ICs, where optionally, the IC set may further include a storage component configured to store data and/or instructions;

(3) an ASIC, for example, a modem (MSM);

(4) a module that can be embedded in another device;

(5) a receiver, a terminal, an intelligent terminal, a cellular phone, a wireless device, a handheld device, a mobile unit, a vehicle-mounted device, a network device, a cloud device, an artificial intelligence device, or the like; or (6) another device or the like.

Figure 6:
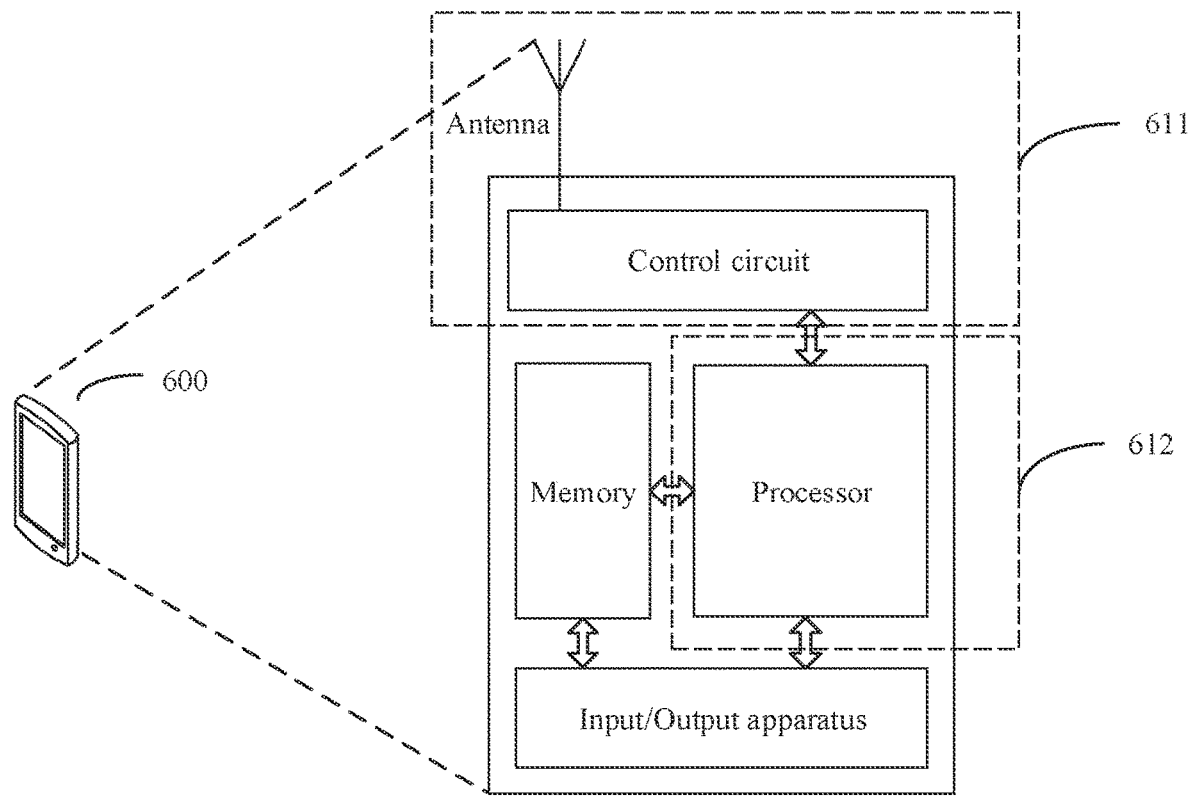
FIG. 6 is a schematic diagram of a structure of a terminal device according to an embodiment of this application.

FIG. 6 is a schematic diagram of a structure of a terminal device according to an embodiment of this application. Refer to FIG. 6. The terminal device may be applied to the scenario shown in FIG. 1 FIG. 2A, FIG. 2B or FIG. 2C. For ease of description, FIG. 6 shows only main parts of the terminal device. As shown in FIG. 6, the terminal device 600 includes a processor, a memory, a control circuit, an antenna, and an input/output apparatus. The processor is mainly configured to: process a communication protocol and communication data, control the entire terminal, execute a software program, and process data of the software program. The memory is mainly configured to store the software program and the data. A radio frequency circuit is mainly configured to: perform conversion between a baseband signal and a radio frequency signal, and process the radio frequency signal. The antenna is mainly configured to receive and send a radio frequency signal in a form of an electromagnetic wave. The input/output apparatus, such as a touchscreen, a display, or a keyboard, is mainly configured to: receive data entered by a user and output data to the user.

After the terminal device is powered on, the processor may read a software program in a storage unit, parse and execute instructions of the software program, and process data of the software program. When data needs to be sent in a wireless manner, after performing baseband processing on the to-be-sent data, the processor outputs a baseband signal to the radio frequency circuit. After processing the baseband signal, the radio frequency circuit obtains a radio frequency signal and sends the radio frequency signal to the outside by using an antenna in a form of an electromagnetic wave. When data is sent to the terminal device, the radio frequency circuit receives a radio frequency signal by using the antenna, further converts the radio frequency signal into a baseband signal, and outputs the baseband signal to the processor; and the processor converts the baseband signal into data, and processes the data.

For ease of description, FIG. 6 shows only one memory and one processor. Actually, the terminal device may include a plurality of processors and a plurality of memories. The memory may also be referred to as a storage medium, a storage device, or the like. This is not limited in the embodiments of the present application.

In an optional implementation, the processor may include a baseband processor and a central processing unit. The baseband processor is mainly configured to process the communication protocol and the communication data, and the central processing unit is mainly configured to: control the entire terminal device, execute the software program, and process the data of the software program. The processor in FIG. 6 integrates functions of the baseband processor and the central processing unit. A person skilled in the art may understand that the baseband processor and the central processing unit may alternatively be independent processors, and interconnected by using a technology such as a bus. A person skilled in the art may understand that the terminal device may include a plurality of baseband processors to adapt to different network standards, the terminal device may include a plurality of central processing units to improve a processing capability of the terminal device, and parts of the terminal device may be connected by using various buses. The baseband processor may also be expressed as a baseband processing circuit or a baseband processing chip. The central processing unit may also be expressed as a central processing circuit or a central processing chip. A function of processing the communication protocol and communication data may be embedded into the processor, or may be stored in the storage unit in a form of a software program, so that the processor executes the software program to implement a baseband processing function.

In an example, the antenna and the control circuit that have receiving and sending functions may be considered as a transceiver unit 611 of the terminal device 600, and the processor having a processing function may be considered as a processing unit 612 of the terminal device 600. As shown in FIG. 6, the terminal device 600 includes the transceiver unit 611 and the processing unit 612. The transceiver unit may also be referred to as a transceiver, a transceiver machine, a transceiver apparatus, or the like. Optionally, a component that is in the transceiver unit 611 and that is configured to implement a receiving function may be considered as a receiving unit, and a component that is in the transceiver unit 611 and that is configured to implement a sending function may be considered as a sending unit. In other words, the transceiver unit 611 includes the receiving unit and the sending unit. For example, the receiving unit may also be referred to as a receiver, a receiver machine, a receiving circuit, or the like, and the sending unit may be referred to as a transmitter, a transmitter machine, a transmitting circuit, or the like. Optionally, the receiving unit and the sending unit may be integrated into one unit, or may be a plurality of units independent of each other. The receiving unit and the sending unit may be located at one geographical location, or may be scattered at a plurality of geographical locations.

Figure 7:
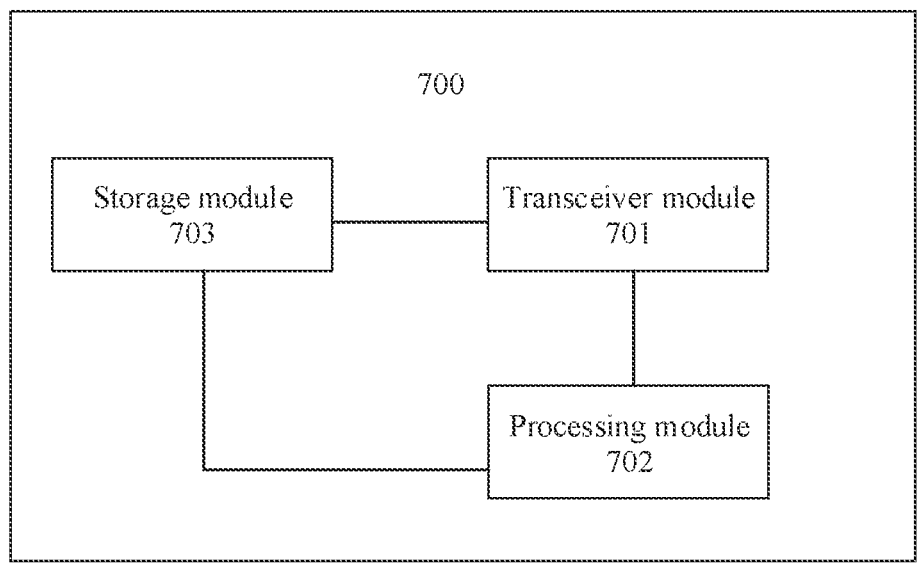
FIG. 7 is a schematic diagram of a structure of an apparatus according to another embodiment of this application.

FIG. 7 is a schematic diagram of a structure of an apparatus according to another embodiment of this application. As shown in FIG. 7, another embodiment of this application provides the apparatus 700. The apparatus 700 may be a terminal device, or may be a component (for example, an integrated circuit or a chip) of the terminal device. Alternatively, the apparatus 700 may be a network device, or may be a component (for example, an integrated circuit or a chip) of the network device. Alternatively, the apparatus 700 may be another communication module, configured to implement the methods corresponding to the first node or the second node in the method embodiments of this application. The apparatus 700 may include a processing module 702 (a processing unit). Optionally, the apparatus 700 may further include a transceiver module 701 (a transceiver unit) and a storage module 703 (a storage unit).

In a possible design, one or more modules in FIG. 7 may be implemented by one or more processors, may be implemented by one or more processors and memories, may be implemented by one or more processors and transceivers, or may be implemented by one or more processors, memories, and transceivers. This is not limited in this embodiment of this application. The processor, the memory, and the transceiver may be separately disposed, or may be integrated together.

The apparatus has a function of implementing the terminal device described in the embodiments of this application. For example, the apparatus includes a module, a unit, or a means corresponding to a step performed by the terminal device in the embodiments of this application, and the function, unit, or means may be implemented by software, may be implemented by hardware, or may be implemented by hardware executing corresponding software. For details, refer to corresponding descriptions in the foregoing corresponding method embodiments.

Alternatively, the apparatus has a function of implementing the network device described in the embodiments of this application. For example, the apparatus includes a module, a unit, or a means corresponding to a step performed by the network device in the embodiments of this application, and the function, unit, or means may be implemented by software, may be implemented by hardware, or may be implemented by hardware executing corresponding software. For details, refer to corresponding descriptions in the foregoing corresponding method embodiments.

Optionally, the modules in the apparatus 700 in the embodiment of this application may be configured to perform the method described in the embodiment shown in FIG. 3 in the embodiments of this application. Alternatively, the modules in the apparatus 700 in the embodiment of this application may be configured to perform the method described in the embodiment shown in FIG. 4 in the embodiments of this application.

In a first possible implementation, the apparatus 700 may include a transceiver module 701 and a processing module 702.

The transceiver module 701 is configured to receive decoding information and coded data from a second node, where the coded data is data obtained after data of a node group in which the apparatus 700 is located is encoded, the data of the node group includes data expected to be received by at least two nodes in the node group, and the at least two nodes include the apparatus 700. The processing module 702 is configured to obtain, based on the decoding information and the coded data, the data expected to be received by the apparatus 700, where the decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

The second node in this embodiment may be a network device or a terminal device.

In this solution, the apparatus 700 receives the decoding information from the second node, and the decoding information is related to the coding matrix or the decoding matrix corresponding to the coded data. Therefore, when decoding the coded data to obtain the data expected to be received by the apparatus 700, the apparatus 700 may perform fast decoding based on the decoding information instead of performing blind decoding, so that the efficiency of the process in which the apparatus 700 decodes the coded data to obtain the data expected to be received by the apparatus 700 is improved.

Optionally, the part of the decoding matrix is one of the following: a first column vector corresponding to the apparatus 700 in the decoding matrix, a first row vector corresponding to the apparatus 700 in the decoding matrix, a sub column vector obtained after first N rows are removed from the first column vector, a sub row vector obtained after first N columns are removed from the first row vector, and a sub decoding matrix obtained after first N rows or first N columns are removed from the decoding matrix, where N is a quantity of nodes included in the node group.

In this solution, when the part of the decoding matrix is the first column vector corresponding to the apparatus 700 or the first row vector corresponding to the apparatus 700 in the decoding matrix, the apparatus 700 can obtain complete decoding information corresponding to the apparatus 700 in the decoding matrix without calculation, to implement complete non-blind decoding. Therefore, power consumption of the apparatus 700 is low, and decoding efficiency is high. When the part of the decoding matrix is the sub column vector obtained after the first N rows are removed from the first column vector or the sub row vector obtained after the first N columns are removed from the first row vector, signaling overheads are relatively small when the second node sends the decoding information to the apparatus 700. When the part of the decoding matrix is the sub decoding matrix obtained after the first N rows or first N columns are removed from the decoding matrix, the second node may send the decoding information to the apparatus 700 in a multicast manner, thereby consuming less resources.

Optionally, an element in the coding matrix or the decoding matrix is 0 or 1; an element in the coding matrix or the decoding matrix is an integer; or an element in the coding matrix or the decoding matrix is a real number.

In this solution, an element in the coding matrix or the decoding matrix may be 0 or 1, may be an integer, or may be a real number, so that a form of the coding matrix or the decoding matrix is relatively flexible.

Optionally, the decoding information is carried in downlink control information (DCI) or a sidelink control information (SCI).

In this solution, a downlink message that may carry the decoding information is provided.

Optionally, the decoding information is one of the following: the coding matrix corresponding to the coded data, the at least one column vector in the coding matrix, the at least one row vector in the coding matrix, the decoding matrix corresponding to the coded data, and the part of the decoding matrix; and an element in the decoding information is 0 or 1. The decoding information is located in a first indicator field of the DCI or the SCI, and a relationship between a length k of the first indicator field and the quantity N of nodes included in the node group is one of the following relationships: $N \leq k/2$, $N \leq \sqrt{k/2}$, $N \leq \sqrt{k}$, and $N \leq k$.

In this solution, it can be ensured that the length of the first indicator field of the DCI or the SCI matches the quantity of nodes included in the node group in which the apparatus 700 is located, so that the second node can successfully send the decoding information to the apparatus 700, so that efficiency of the process in which the apparatus 700 decodes the coded data to obtain the data expected to be received by the apparatus 700 is improved.

In another possible implementation, the apparatus 700 may include a transceiver module 701 and a processing module 702.

The processing module 702 is configured to generate coded data, where the coded data is data obtained after data of a node group in which a first node is located is encoded, the data of the node group includes data expected to be received by at least two nodes in the node group, and the at least two nodes include the first node. The transceiver module 701 is configured to send decoding information and the coded data to the first node, where the decoding information is one of the following: a coding matrix corresponding to the coded data, indication information of the coding matrix, at least one column vector in the coding matrix, at least one row vector in the coding matrix, indication information of the at least one column vector, indication information of the at least one row vector, a decoding matrix corresponding to the coded data, indication information of the decoding matrix, a part of the decoding matrix, and indication information of the part of the decoding matrix.

The first node in this embodiment may be a terminal device.

In this solution, the apparatus 700 sends the decoding information to the first node, and the decoding information is related to the coding matrix or the decoding matrix corresponding to the coded data. Therefore, when decoding the coded data to obtain the data expected to be received by the first node, the first node may perform fast decoding based on the decoding information instead of performing blind decoding, so that efficiency of a process in which the first node decodes the coded data to obtain the data expected to be received by the first node is improved.

Optionally, the part of the decoding matrix is one of the following: a first column vector corresponding to the first node in the decoding matrix, a first row vector corresponding to the first node in the decoding matrix, a sub column vector obtained after first N rows are removed from the first column vector, a sub row vector obtained after first N columns are removed from the first row vector, and a sub decoding matrix obtained after first N rows or first N columns are removed from the decoding matrix, where N is a quantity of nodes included in the node group.

In this solution, when the part of the decoding matrix is the first column vector corresponding to the first node or the first row vector corresponding to the first node in the decoding matrix, the first node can obtain complete decoding information corresponding to the first node in the decoding matrix without calculation, to implement complete non-blind decoding. Therefore, power consumption of the first node is low, and decoding efficiency is high. When the part of the decoding matrix is the sub column vector obtained after the first N rows are removed from the first column vector or the sub row vector obtained after the first N columns are removed from the first row vector, signaling overheads are relatively small when the apparatus 700 sends the decoding information to the apparatus. When the part of the decoding matrix is the sub decoding matrix obtained after the first N rows or first N columns are removed from the decoding matrix, the apparatus 700 may send the decoding information to the apparatus in a multicast manner, thereby consuming less resources.

Optionally, an element in the coding matrix or the decoding matrix is 0 or 1; an element in the coding matrix or the decoding matrix is an integer; or an element in the coding matrix or the decoding matrix is a real number.

In this solution, an element in the coding matrix or the decoding matrix may be 0 or 1, may be an integer, or may be a real number, so that a form of the coding matrix or the decoding matrix is relatively flexible.

Optionally, the decoding information is carried in downlink control information (DCI) or a sidelink control information (SCI).

In this solution, a downlink message that may carry the decoding information is provided.

Optionally, the decoding information is one of the following: the coding matrix corresponding to the coded data, the at least one column vector in the coding matrix, the at least one row vector in the coding matrix, the decoding matrix corresponding to the coded data, and the part of the decoding matrix; and an element in the decoding information is 0 or 1. The decoding information is located in a first indicator field of the DCI or the SCI, and a relationship between a length k of the first indicator field and the quantity N of nodes included in the node group is one of the following relationships: $N \leq k/2$, $N \leq \sqrt{k/2}$, $N \leq \sqrt{k}$, and $N \leq k$.

In this solution, it can be ensured that the length of the first indicator field of the DCI or the SCI matches the quantity of nodes included in the node group in which the first node is located, so that the apparatus 700 can successfully send the decoding information to the first node, so that efficiency of the process in which the first node decodes the coded data to obtain the data expected to be received by the first node is improved.

It should be understood that the processor in this embodiment of this application may be an integrated circuit chip, and has a signal processing capability. In an implementation process, the steps in the foregoing method embodiments can be completed by using a hardware integrated logical circuit in the processor, or by using instructions in a form of software. The foregoing processor may be a general-purpose processor, a digital signal processor (DSP), an application-specific integrated circuit (ASIC), a field programmable gate array (FPGA) or another programmable logic device, a discrete gate or transistor logic device, or a discrete hardware component.

It may be understood that the memory in the embodiments of this application may be a transitory memory or a non-transitory memory, or may include both a transitory memory and a non-transitory memory. The non-transitory memory may be a read-only memory (ROM), a programmable read-only memory (programmable ROM, PROM), an erasable programmable read-only memory (erasable PROM, EPROM), an electrically erasable programmable read-only memory (electrically EPROM, EEPROM), or a flash memory. The transitory memory may be a random access memory (RAM), used as an external cache. Through examples rather than limitative descriptions, RAMs in many forms may be used, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchlink dynamic random access memory (synchlink DRAM, SLDRAM), and a direct rambus random access memory (direct rambus RAM, DR RAM). It should be noted that the memories in the systems and methods described in this specification include but are not limited to these memories and any memory of another proper type.

This application further provides a computer-readable medium. The computer-readable medium stores a computer program. When the computer program is executed by a computer, a function in any one of the foregoing method embodiments is implemented.

This application further provides a computer program product. When the computer program product is executed by a computer, a function in any one of the foregoing method embodiments is implemented.

All or some of the foregoing embodiments may be implemented by using software, hardware, firmware, or any combination thereof. When being implemented by using the software, all or some of the embodiments may be implemented in a form of a computer program product. The computer program product includes one or more computer instructions. When the computer instructions are loaded and executed on a computer, the procedures or functions according to the embodiments of this application are all or partially generated. The computer may be a general-purpose computer, a dedicated computer, a computer network, or another programmable apparatus. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a high-density digital video disc (DVD)), a semiconductor medium (for example, a solid-state drive (SSD)), or the like.

It should be understood that "embodiment" in the entire specification means that particular features, structures, or characteristics related to the embodiment are included in at least one embodiment of this application. Therefore, the embodiments in the entire specification do not necessarily refer to a same embodiment. In addition, these particular features, structures, or characteristics may be combined in one or more embodiments in any appropriate manner. It should be understood that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

It should be further understood that, in this application, "when" and "if" mean that UE or a base station performs corresponding processing in an objective situation, and are not intended to limit time, and the UE or the base station is not necessarily required to have a determining action during implementation, and do not mean any other limitation.

In this application, unless otherwise specified, an element represented in a singular form is intended to represent "one or more", but is not intended to represent "one and only one". In this application, unless otherwise specified, "at least one" is intended to represent "one or more", and "a plurality of" is intended to represent "two or more".

In addition, the terms "system" and "network" in this specification may be often used interchangeably in this specification. The term "and/or" in this specification describes only an association relationship for describing associated objects and represents that three relationships may exist. For example, A and/or B may represent the following three cases: only A exists, both A and B exist, and only B exists. A may be singular or plural, and B may be singular or plural.

The character "/" usually represents an "or" relationship between the associated objects.

The term "at least one of . . . " in this specification indicates all or any combination of listed items. For example, "at least one of A, B, and C" may indicate the following six cases: A exists alone, B exists alone, C exists alone, A and B coexist, B and C coexist, and A, B, and C coexist. A may be singular or plural, B may be singular or plural, and C may be singular or plural.

It should be understood that in the embodiments of this application, "B corresponding to A" represents that B is associated with A, and B may be determined based on A. However, it should be further understood that determining B based on A does not mean that B is determined based on only A. B may alternatively be determined based on A and/or other information.

The correspondences shown in the tables in this application may be configured, or may be predefined. Values of the information in the tables are merely examples, and other values may be configured. This is not limited in this application. When a correspondence between information and each parameter is configured, not all correspondences shown in the tables need to be configured. For example, in a table in this application, correspondences shown in some rows may alternatively not be configured. For another example, proper deformations and adjustments such as splitting and combination may be performed based on the foregoing tables. Names of the parameters shown in titles of the foregoing tables may also be other names that can be understood by a communication apparatus, and values or representation manners of the parameters may also be other values or representation manners that can be understood by the communication apparatus. During implementation of the foregoing tables, another data structure, such as an array, a queue, a container, a stack, a linear table, a pointer, a linked list, a tree, a graph, a structure, a class, a pile, or a hash table, may be used.

Predefining in this application may be understood as "define", "predefine", "store", "pre-store", "pre-negotiate", "pre-configure", "solidify", or "pre-burn".

A person of ordinary skill in the art may be aware that, in combination with units and algorithm steps in the examples described in the embodiments disclosed in this specification, the embodiments may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in another manner. For example, the described apparatus embodiments are merely examples. For example, division into the units is merely logical function division, and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one location, or may be distributed on a plurality of network units. Some or all of the units may be selected based on actual requirements to achieve the objectives of the solutions in the embodiments.

In addition, function units in the embodiments of this application may be integrated into one processing unit, or each of the units may exist alone physically, or two or more units may be integrated into one unit.

When the functions are implemented in a form of a software function unit and sold or used as an independent product, the functions may be stored in a computer-readable storage medium. Based on such an understanding, the technical solutions of this application essentially, or the part contributing to the current technology, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of the present application, but are not intended to limit the protection scope of the present application. Any variation or replacement readily figured out by a person skilled in the art in the technical scope disclosed in the present application shall fall in the protection scope of the present application. Therefore, the protection scope of the present application should be subject to the protection scope of the claims.

What is claimed is:

1. A communication method, comprising:
receiving, by a first node, decoding information and coded data from a second node, wherein the coded data is obtained after data of a node group in which the first node is located is encoded, the data of the node group comprises data expected to be received by at least two nodes in the node group, and the at least two nodes comprise the first node; and obtaining, by the first node based on the decoding information and the coded data, data expected to be received by the first node, wherein
the decoding information comprises at least a portion of a coding matrix corresponding to the coded data, and wherein the decoding information is indicated by downlink control information (DCI) or sidelink control information (SCI), and the decoding information is located in a first indicator field of the DCI or the SCI, and a relationship between a length k of the first indicator field and a quantity N of nodes comprised in the node group is one of the following relationships: $N \leq k/2$, $N \leq \sqrt{k/2}$, $N \leq \sqrt{k}$, and $N \leq k$.

2. The method according to claim 1, wherein each element in the coding matrix is 0 or 1.

3. An apparatus for a first node, comprising:
one or more processors;
a memory coupled to the one or more processors, the memory storing a program to be executed by the one or more processors and including instructions that cause the apparatus to:
receive decoding information and coded data from a second node, wherein the coded data is obtained after data of a node group in which the first node is located is encoded, the data of the node group comprises data expected to be received by at least two nodes in the node group, and the at least two nodes comprise the first node; and
obtain, based on the decoding information and the coded data, data expected to be received by the first node, wherein
the decoding information comprises at least a portion of a coding matrix corresponding to the coded data, and wherein the decoding information is indicated by downlink control information (DCI) or sidelink control information (SCI), and the decoding information is located in a first indicator field of the DCI or the SCI, and a relationship between a length k of the first indicator field and a quantity N of nodes comprised in the node group is one of the following relationships: $N \leq k/2$, $N \leq \sqrt{k/2}$, $N \leq \sqrt{k}$, and $N \leq k$.

4. The apparatus according to claim 3, wherein each element in the coding matrix is 0 or 1.

5. A non-transitory computer readable medium storing instructions that, when executed by one or more processors of a first node, cause the first node to:
receive decoding information and coded data from a second node, wherein the coded data is obtained after data of a node group in which the first node is located is encoded, the data of the node group comprises data expected to be received by at least two nodes in the node group, and the at least two nodes comprise the first node; and
obtain, based on the decoding information and the coded data, data expected to be received by the first node, wherein
the decoding information comprises at least a portion of a coding matrix corresponding to the coded data, and wherein the decoding information is indicated by downlink control information (DCI) or sidelink control information (SCI), and the decoding information is located in a first indicator field of the DCI or the SCI, and a relationship between a length k of the first indicator field and a quantity N of nodes comprised in the node group is one of the following relationships: $N \leq k/2$, $N \leq \sqrt{k/2}$, $N \leq \sqrt{k}$, and $N \leq k$.

6. The non-transitory computer readable medium according to claim 5, wherein each element in the coding matrix is 0 or 1.

* * * * *